United States Patent
Raj et al.

(10) Patent No.: US 9,173,282 B2
(45) Date of Patent: Oct. 27, 2015

(54) INTERCONNECT STRUCTURES AND METHODS OF MAKING THE SAME

(75) Inventors: Pulugurtha Markondeya Raj, Tucker, GA (US); Nitesh Kumbhat, Atlanta, GA (US); Venkatesh Sundaram, Alpharetta, GA (US); Rao R. Tummala, Greensboro, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 340 days.

(21) Appl. No.: 13/638,536

(22) PCT Filed: Mar. 31, 2011

(86) PCT No.: PCT/US2011/030833
§ 371 (c)(1),
(2), (4) Date: Dec. 10, 2012

(87) PCT Pub. No.: WO2011/123717
PCT Pub. Date: Oct. 6, 2011

(65) Prior Publication Data
US 2013/0107485 A1    May 2, 2013

Related U.S. Application Data

(60) Provisional application No. 61/319,617, filed on Mar. 31, 2010.

(51) Int. Cl.
*H01R 9/00* (2006.01)
*H05K 1/02* (2006.01)
(Continued)

(52) U.S. Cl.
CPC ........ *H05K 1/0213* (2013.01); *H01L 23/49827* (2013.01); *H01L 24/81* (2013.01);
(Continued)

(58) Field of Classification Search
USPC .......................................... 361/774; 174/261
See application file for complete search history.

(56) References Cited

U.S. PATENT DOCUMENTS

| 5,281,771 A | 1/1994 | Swift et al. |
| 6,000,126 A | 12/1999 | Pai |

(Continued)

OTHER PUBLICATIONS

International Preliminary Report on Patentability dated Oct. 2, 2012 for related International Patent Application No. PCT/US2011/030833.

(Continued)

*Primary Examiner* — Andargie M Aychillhum
(74) *Attorney, Agent, or Firm* — Troutman Sanders LLP; Ryan A. Schneider; Elizabeth-Ann Weeks

(57) ABSTRACT

The various embodiments of the present invention provide a stress-relieving, second-level interconnect structure that is low-cost and accommodates TCE mismatch between low-TCE packages and PCBs. The various embodiments of the interconnect structure are reworkable and can be scaled to pitches from about 1 millimeter (mm) to about 150 micrometers (μm). The interconnect structure comprises a dielectric body element and at least one interconnection array that provides a conductive path between two electronic components. Each interconnection array comprises a plurality of wires that provide both conductivity and compliance to the overall interconnect structure. The versatility and scalability of the interconnect structure of the present invention make it a desirable structure to utilize in current two-dimensional and ever-evolving three-dimensional IC structures.

11 Claims, 26 Drawing Sheets

(51) Int. Cl.
H01L 23/498 (2006.01)
H01L 25/065 (2006.01)
H01R 12/52 (2011.01)
H01R 12/71 (2011.01)
H05K 3/34 (2006.01)
H05K 1/18 (2006.01)
H05K 3/10 (2006.01)
H01L 29/41 (2006.01)
H01L 23/13 (2006.01)
H01L 25/10 (2006.01)
H01L 23/00 (2006.01)

(52) U.S. Cl.
CPC .......... *H01L25/0657* (2013.01); *H01L 29/413* (2013.01); *H01R 12/52* (2013.01); *H01R 12/714* (2013.01); *H05K 1/18* (2013.01); *H05K 3/107* (2013.01); *H05K 3/3436* (2013.01); *H01L 23/13* (2013.01); *H01L 24/13* (2013.01); *H01L 24/16* (2013.01); *H01L 25/105* (2013.01); *H01L 2224/131* (2013.01); *H01L 2224/16237* (2013.01); *H01L 2224/45147* (2013.01); *H01L 2224/8182* (2013.01); *H01L 2224/8185* (2013.01); *H01L 2224/81191* (2013.01); *H01L 2224/81203* (2013.01); *H01L 2224/81207* (2013.01); *H01L 2224/81385* (2013.01); *H01L 2224/81399* (2013.01); *H01L 2224/81815* (2013.01); *H01L 2224/81897* (2013.01); *H01L 2225/06517* (2013.01); *H01L 2225/06541* (2013.01); *H01L 2225/06572* (2013.01); *H01L 2924/00014* (2013.01); *H01L 2924/01029* (2013.01); *H01L 2924/09701* (2013.01); *H01L 2924/14* (2013.01); *H01L 2924/1579* (2013.01); *H01L 2924/15311* (2013.01); *H01L 2924/15787* (2013.01); *H01L 2924/15791* (2013.01); *H05K 2201/0248* (2013.01); *H05K 2201/0281* (2013.01); *H05K 2201/10378* (2013.01); *H05K 2201/10674* (2013.01)

(56) References Cited

U.S. PATENT DOCUMENTS

| | | | |
|---|---|---|---|
| 6,264,476 B1 * | 7/2001 | Li et al. | 439/66 |
| 6,438,831 B1 | 8/2002 | Hagihara | |
| 7,220,131 B1 | 5/2007 | Pecht et al. | |
| 2006/0046468 A1 | 3/2006 | Akram et al. | |
| 2008/0096379 A1 | 4/2008 | Solzbacher et al. | |

OTHER PUBLICATIONS

International Search Report dated Aug. 17, 2011 for related International Patent Application No. PCT/US2011/030833.

Written Opinion dated Aug. 17, 2011 for related International Patent Application No. PCT/US2011/030833.

International Search Report and Written Opinion dated Aug. 17, 2011 for related PCT Patent Application No. PCT/US2011/030833.

* cited by examiner

- Pitch= 1.0mm
- Si Thickness= 1.0mm
- FR-4 Thickness= 1.0mm
- Stand-Off= 0.3mm
- Wire Dia= 1.0μm
- Wire Spacing= 50μm
- Bundle Width= 0.3mm
- Top Solder= 50μm
- Bottom Solder= 50μm
- Polymer Film Thickness= 50μm
- Free Wire Length Top= 25μm
- Free Wire Length Bottom= 25μm

INTERCONNECT STRUCTURES AND METHODS OF MAKING THE SAME

CROSS-REFERENCE TO RELATED APPLICATION

This application claims the benefit of U.S. Provisional Patent Application Ser. No. 61/319,617, filed 31 Mar. 2010, which is incorporated herein by reference in its entirety as if fully set forth below.

BACKGROUND

1. Field

The various embodiments of the present invention relate to interconnect structures, wherein features of the interconnect structure may be altered to achieve desired fine-pitch and low-stress properties, and to methods of making and using the same.

2. Description of Related Art

Interconnects facilitate electrical communication between various electronic components within an electronic system. A "first-level" interconnect, for example, facilitates electrical communication between integrated circuits ("ICs") and package leadframes. A "second-level" interconnect, for example, facilitates electrical communication between packages and printed circuit boards ("PCBs").

As the semiconductor industry migrates from two-dimensional ICs to three-dimensional ICs, new second-level interconnect structures that achieve higher electrical performance and successfully integrate heterogeneous ICs are needed. Specifically, new packaging techniques that are cost-effective, thermo-mechanically reliable, and provide compliant and reworkable second-level interconnections from large-body, low thermal coefficient of expansion ("TCE") packages to PCBs at fine pitches are desirable.

Two second-level interconnect structures are currently used. The first structure is based on land grid array ("LGA") packages, which are assembled onto a socket with flexible pins that contact lands on the package. These sockets are typically assembled onto a PCB with the help of solders. The package is then plugged into the sockets, therefore making it removable and reworkable for processor upgrades. The second structure is a solder based assembly that does not require an underfill.

These interconnect structures, however, face fundamental challenges as the trend towards three-dimensional ICs and silicon and glass-based low-TCE interposer packages with fine-pitch board level assembly gains momentum. First, providing a means for stress-relief within the current interconnect structures can be costly. Lower cost options, however, tend to induce tremendous TCE mismatch between low-TCE packages and PCBs. This mismatch subsequently creates fundamental limitations in scaling down the pitch size with traditional solder compositions. Third, current underfill requirements prevent reworkability.

Alternative second-level interconnect structures are thus desirable that address these fundamental limitations and enhance thermo-mechanical reliability without compromising cost, reworkability, or electrical performance.

BRIEF SUMMARY

Various embodiments of the present invention provide an interconnect structure, comprising a dielectric body element comprising a top surface and a bottom surface and at least one interconnection array comprising a plurality of conductive wires dispersed within the dielectric body element. A first portion of each of the conductive wires extends substantially perpendicularly beyond the top surface of the dielectric body element and a second portion of each of the conductive wires extends substantially perpendicularly beyond the bottom surface of the dielectric body element. Each of the conductive wires is physically and electrically isolated from each other at least within the dielectric body element. Further, the first and second portions can be configured to provide compliance upon application of physical stresses thereto. Additionally, each of the at least one interconnection arrays can be configured to establish a conductive path between two independent electronic components.

In an embodiment, a fraction of the first and second portions can comprise a coating configured to minimize or prevent surface wetting by a solder composition.

In other embodiments, a ratio of the first portion to the second portion can be greater than or equal to about 1.

The dielectric body element can be a low stiffness polymer. The dielectric body can also be a high stiffness polymer, polymer-glass composite, or a ceramic material.

An average cross-sectional dimension of each of the plurality of conductive wires can be about 10 nanometers to about 50 micrometers.

In other embodiments, spacing between each of the at least one interconnection arrays can be about 5 to about 1000 micrometers. Further, spacing between each conductive wire within the interconnection array can be about 10 nanometers to about 50 micrometers.

Alternative embodiments provided a system of interconnected electronic devices, the system comprising a first electronic component, a second electronic component, and an interconnect structure interposed between the first and second electronic components. The interconnect structure can comprise a dielectric body element comprising a top surface and a bottom surface, at least one interconnection array comprising a plurality of conductive wires dispersed within the dielectric body element. A first portion of each of the conductive wires extends substantially perpendicularly beyond the top surface of the dielectric body element and a second portion of each of the conductive wires extends substantially perpendicularly beyond the bottom surface of the dielectric body element.

Each of the conductive wires are physically and electrically isolated from each other at least within the dielectric body element. Further, the first and second portions can be configured to provide compliance upon application of physical stresses thereto. Additionally, each of the at least one interconnection arrays can be configured to establish a conductive path between two independent electronic components.

The interconnect structure can be a second-level interconnect structure. Further, a fraction of the first portion and the second portion are coated.

Other embodiments provide a method of manufacturing an interconnect structure, the method comprising providing a dielectric body element comprising a top surface, bottom surface, and at least one interconnection array comprising a plurality of conductive wires, and removing a portion of the top surface and the bottom surface of the dielectric body element, such that a first portion and second portion of each of the conductive wires extends substantially perpendicularly beyond the top surface and the bottom surface, respectively, of the dielectric body element. Each of the conductive wires is physically and electrically isolated from each other at least within the dielectric body element. The first and second portions can be configured to provide compliance upon application of physical stresses thereto. Each of the at least one interconnection arrays can be configured to establish a conductive path between two independent electronic components.

The method can further comprise coating at least a fraction of the first and second portions of each of the conductive wires to minimize or prevent surface wetting by a solder composition.

Alternative embodiments provide a method of manufacturing an interconnect structure, the method comprising forming a plurality of channels within a dielectric body element, forming a conductive wire within each channel of the plurality of channels, and removing at least a portion of a first surface and at least a portion of a second surface of the dielectric body element to expose portions of the conductive wires from the dielectric body element.

The method can further comprise patterning a photoresist on a first surface of the dielectric body element and removing the photoresist from the first surface of the dielectric body element.

Forming the plurality of channels can comprise anodization, plasma etching, laser drilling, lithographic techniques using photosensitive polymers, and/or molding a polymer over a wire template and subsequently releasing the polymer.

Forming the conductive wire within each channel can comprise electrolytic plating and/or electroless plating.

Removing the at least the portion of the first surface and the at least the portion of the second surface of the dielectric body element can comprise etching the at least the portion of the first and second surfaces.

Removing the at least the portion of the first surface and the at least the portion of the second surface of the dielectric body element can comprise chemical dissolution of the at least the portion of the first and second surfaces.

The method can further comprise coating a fraction of the exposed portion of the conductive wires to minimize or prevent surface wetting by a solder composition. Coating the fraction of the exposed portion can comprise selective removal of the dielectric body element such that a portion of the dielectric body element is the coating.

DETAILED DESCRIPTION

Figure 1:
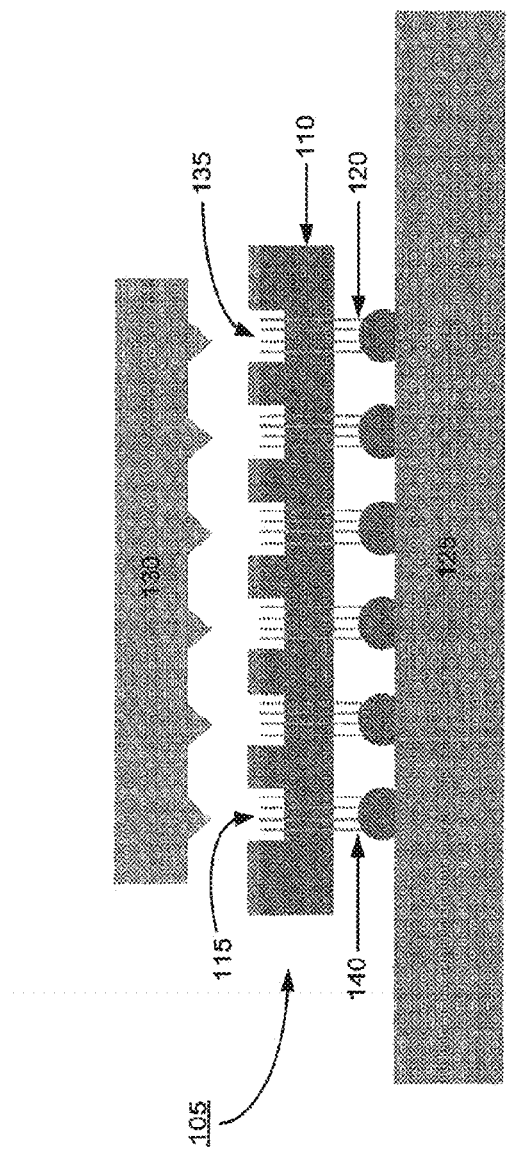
FIG. 1 illustrates a second-level interconnect structure interposed between two electrical components, in accordance with exemplary embodiments of the present invention.

Referring now to the figures, wherein like reference numerals represent like parts throughout the several views, exemplary embodiments of the present invention will be described in detail. Throughout this description, various components can be identified as having specific values or parameters, however, these items are provided as exemplary embodiments. Indeed, the exemplary embodiments do not limit the various aspects and concepts of the present invention as many comparable parameters, sizes, ranges, and/or values can be implemented.

It should also be noted that, as used in the specification and the appended claims, the singular forms "a," "an," and "the" include plural references unless the context clearly dictates otherwise. For example, reference to a component is intended also to include composition of a plurality of components. References to a composition containing "a" constituent is intended to include other constituents in addition to the one named. Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Values may be expressed herein as "about" or "approximately" one particular value, this is meant to encompass the one particular value and other values that are relatively close but not exactly equal to the one particular value. By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a composition does not preclude the presence of additional components than those expressly identified.

As used herein, the terms "interconnect" and "interconnect structure" may used interchangeably and refer to devices that can be used for connecting electronic components across one or more of the generally accepted six levels of interconnection in an electronic system. Further, the term printed wiring board ("PWB") and printed circuit boards ("PCBs") may be used interchangeably.

The various embodiments of the present invention provide a stress-relieving, second-level interconnect structure that is low-cost and accommodates TCE mismatch between low-TCE packages and PCBs. The various embodiments of the interconnect structure are reworkable and can be scaled to pitches from about 1 millimeter (mm) to about 150 micrometers (μm).

The stress-relief interconnect structure is surface mount technology ("SMT") compatible and thus can be bonded to an interposer and can serve as a vertical interconnect that decouples the stresses and strains between the bonded devices, packages, or boards. In other embodiments, the stress-relief interconnect structure can be used as a thin film socket, also known as a "nano stress-relief socket" ("NSS"), designed to plug-in a die or interposer on one side and assembled on a package or printed wiring board ("PWB") using solders on the other side.

The versatility and scalability of the interconnect structure of the present invention make it a desirable structure to utilize in current two-dimensional and ever-evolving three-dimensional IC structures.

Referring to FIG. 1, exemplary embodiments of the interconnect structure 115 comprise a dielectric body element 110, at least one interconnection array 115 dispersed within the dielectric body element 110, and a plurality of conductive wires 120 within the at least one interconnection array 115.

The dielectric body element 110 is formed from a nonconductive element and thus electrically isolates two independent electrical components 125/130 from each other. The dielectric body element 110 can be made from a polymeric material, and more specifically, can be made from a low-stiffness polymer, a high stiffness polymer, polymer-glass composite, or a ceramic material. In exemplary embodiment, the stiffness values range from about 0.1 GPa to about 50 GPa. The polymers can be silicones, epoxies, fluoropolymers, siloxanes, reinforced prepregs, and others. The dielectric body element 110 has a top surface and a bottom surface, and in exemplary embodiments, the thickness of the dielectric body element 110 (i.e., the distance between the top surface and the bottom surface) can be about 10 μm to about 50 μm. The thickness of the dielectric body element 110, however, is not limited to these parameters.

At least one interconnection array 115 can be dispersed within the dielectric body element 110. In other exemplary embodiments, a plurality of interconnection arrays 115 can be uniformly dispersed within the dielectric body element. Each interconnection array 115 is physically and electrically isolated from other interconnection arrays 115. In exemplary embodiments, spacing between each of the interconnection arrays 115 can be about 5 μm to about 1000 μm (1 mm), and the width of the interconnection arrays can be about 300 μm (0.3 mm). Each interconnection array 115 provides an isolated conductive path between two electronic components 125/130. For example, embodiments that comprise two interconnection arrays 115 provide two separate conductive paths between electronic components 125/130. Because the dielectric body element 110 is nonconductive, the interconnection arrays 115 enable electrical communication between the two electronic components. The electronic components 125/130 can be, for example, an integrated circuit, an interposer, a substrate, a printed circuit board, a printed wiring board.

Each interconnection array 115 comprises a plurality of conductive wires 120. In exemplary embodiment, each interconnect array 115 comprises ten to thousands of conductive wires 120. One skilled in the art will understand that the term "wires" is synonymous with fibers and all derivatives thereof. The conductive wires 120 are configured such that a first portion 135 of each of the conductive wires 120 extends substantially perpendicularly beyond the top surface of the dielectric body element 110 and a second portion 140 of each of the conductive wires extends substantially perpendicularly beyond the bottom surface of the dielectric body element 110.

The conductive wires 120 are physically and electrically isolated from each other at least within the dielectric body element 110. However, upon an application of physical stress, the first portion 135 and second portion 140 of the conductive wires 120 may slightly deform and come into physical and/or electrical contact outside of the dielectric body element 110. The isolation of the conductive wires 120 within the dielectric body element 110 provides near-zero stress compliance to the interconnection structure 105 when interposed between two electrical components 125/130. Thus, one element, i.e., the conductive wires 120, is responsible for providing both conductivity and near-zero stress compliance to the interconnect structure 105.

The conductive wires 120 can be formed from many conductive materials and can be of many shapes and sizes. For example, the conductive wires can be made from copper, carbon fiber, carbon/graphite fiber, doped silicon, conductive particle or ionic salt filled polymeric fibers, and/or metallized fibers. Other materials can include nickel, aluminum, or other metals or metallic alloys, conducting polymers, and conducting oxide fibers. Further, the cross-section of the conductive wires 120 can be of many geometrical configurations. In exemplary embodiments, the cross-section of the conductive wires 120 are substantially circular and the average cross-sectional dimension of the conductive wires 120 can be about 10 nanometers (nm) to about 10 μm. The conductive wires can be, for example, nanowires, nanotubes, nanorods, microwires, microtubes, and/or microrods.

In exemplary embodiments, the length of the first portion 135 and the second portion 140 of the conductive wires 120 ranges from about 10 μm to about 80 μm. In one embodiment, the first portion 135 is longer than the length of the second portion 140. In another embodiment, the ratio of the first portion 135 to the second portion 140 is greater than or equal to about 1. This configuration enhances the overall compliance of the interconnect structure 120. Thus, one skilled in the art will understand that the lengths of the first portion relative to the second portion can be manipulated to achieve desired compliance.

Further, one skilled in the art will understand that the parameters described in reference to the dielectric body element 110, the interconnection arrays 115, and the conductive wires 120 can be manipulated to achieve a desired pitch size, therefore making the exemplary embodiments of the interconnect structure 105 desirable for three-dimensional interposer applications. The interconnect structure 105 can also be extended to other critical technologies, such as wafer-probing and hermetic feed-throughs for biocompatible packaging.

Figure 2A:
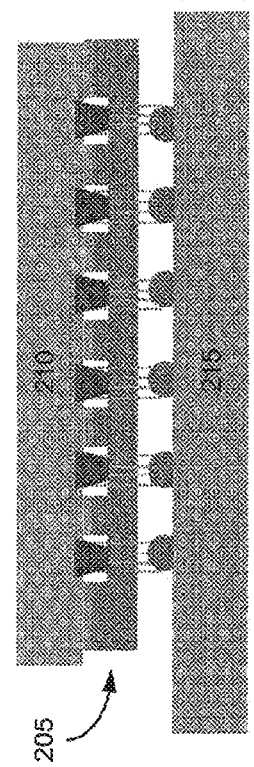
FIGS. 2a-b illustrate SMT-compatible, second-level interconnect structures, in accordance with exemplary embodiments of the present invention.
Figure 2B:
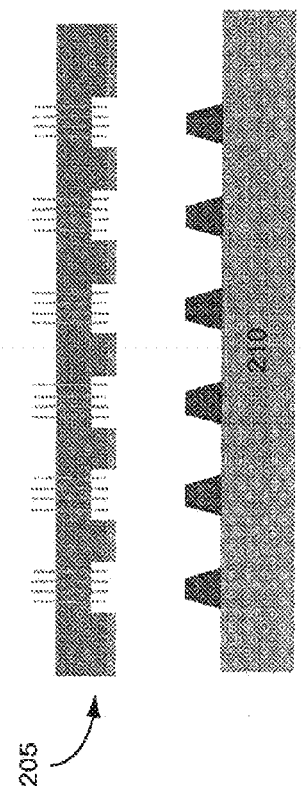
Figure 3:
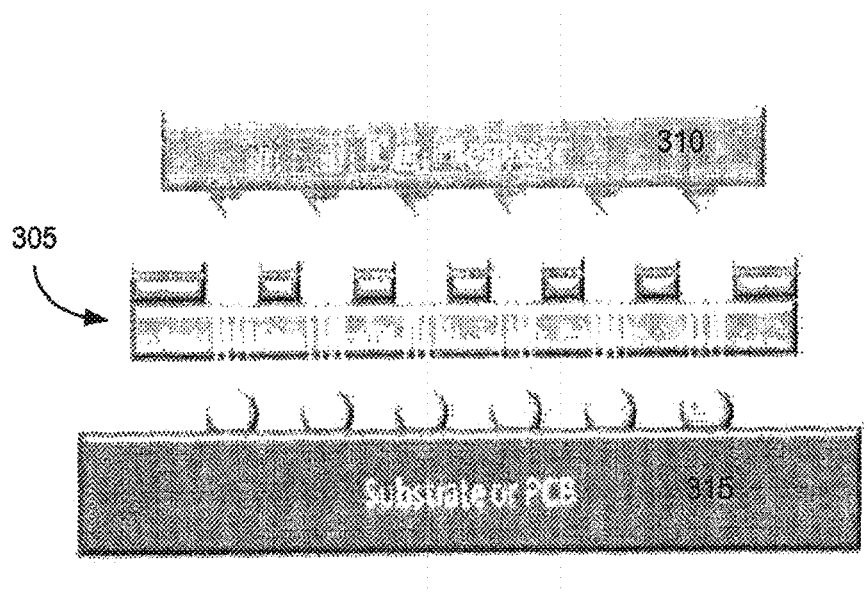
FIG. 3 illustrates a nano stress-relief socket ("NSS"), second-level interconnect structure, in accordance with exemplary embodiments of the present invention.

The various embodiments of the interconnect structure 105 are both SMT and NSS compliant. Referring to FIGS. 2a and 2b, there is shown an SMT-compliant interconnect structure 205. In this embodiment, the interconnect structure 205 can be surface-mounted to an IC or interposer 210 and serve as a vertical interconnect that decouples the stresses and strains between the bonded devices, packages, or boards 215. Referring to FIG. 3, there is shown an NSS-compatible interconnect structure 305 designed to "plug-in" a die or interposer 310 on one side and assembled on a package or PWB 315 on the other side.

In exemplary embodiments of the interconnect structure 105, the interconnection arrays 115 can provide conductive paths between two electrical components 125/130 via solder connections disposed on the interconnection-facing side of each of the electrical components. As the interconnect structure 105 is interposed between two electrical components 125/130, the conductive wires 120 of the interconnection arrays 115 physically engage the solder compositions. The solder can then "wick" or flow up and through the conductive wires 120. In most embodiments, however, it is undesirable for the solder to completely saturate the conductive wire 120 as over-saturation interferes with the overall compliance of the interconnect structure 105. Thus, to limit surface-wetting from the solder composition, a fraction of the first portion 135 and second portion 140 of the conductive wires 120 can be coated. Coatings that can prevent solder wetting are made of conformal polymers, oxides, nitrides, or non-wettable metals, such as titanium and nickel. These coatings can then be selectively removed from the tip of the fibers to allow wetting only on the top portion of the fibers. This coating thus allows the solder composition to partially wick at the tip of the conductive wires 120, yet effectively prevents the solder composition from bonding to the side walls and penetrating the interior portion of the conductive wires 120.

In other embodiments, the interconnection arrays 115 can provide conductive paths between two electrical components 125/130 using other bonding methods such as conductive or non-conductive adhesives, mechanical interlocking, thermocompression, thermosonic, or diffusion bonding.

Figure 4:
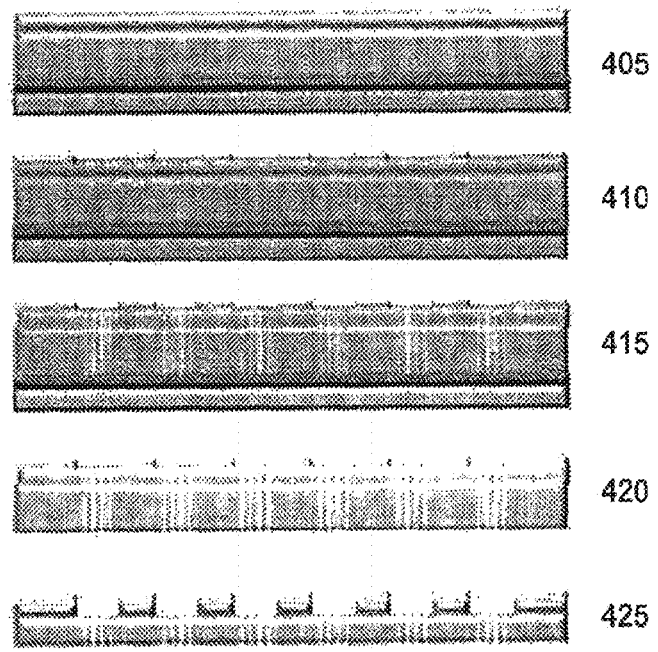
FIG. 4 illustrates a method of making the various embodiments of second-level interconnect structure, in accordance with exemplary embodiments of the present invention.

FIG. 4 provides an exemplary method for manufacturing the interconnect structure 105. A low-stiffness, polymeric dielectric body element is first provided and a plurality of channels are formed therein 405. The plurality of channels can be uniformly dispersed within the dielectric body element and can extend from a first surface to a second surface of the dielectric body element. One skilled in the art will appreciate that the plurality of channels coincide with the interconnection arrays of the completed interconnect structure. The plurality of channels can be fabricated through both top-down and bottom-up approaches, which reduces the overall manufacturing cost and enables the interconnect structure to be scaled to any pitch. The channels can be formed using various techniques, for example, anodization of metal foils to form porous nanochannel structures (some class of which are referred to as Anodized Aluminum Oxide templates—AAO), laser drilling, plasma etching, ion bombardment, nanoimprinting, and/or embossing techniques. Further, the plurality of channels can be defined within the dielectric body element to be micro-sized, nano-sized, or a combination thereof.

Figure 30:
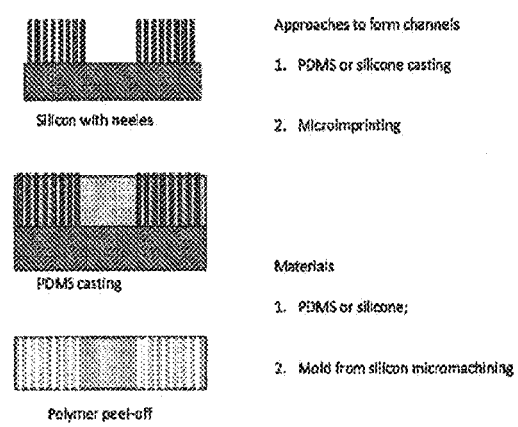
FIGS. 30-32 illustrate various methods of making nanochannels, in accordance with exemplary embodiments of the present invention.

The channels can be made in a pre-patterned way with a photoresist to define the channels followed by plasma etching or laser ablation, or using a CAD (computer aided design) controlled drilling process using laser or mechanical processes, or lithographic processes for photosensitive dielectrics. The channels can also be made by forming reverse mold with metal or silicon needles, filling it with polymer, and then remove the mold to form channels in-situ, as illustrated in FIG. 30.

Figure 31:
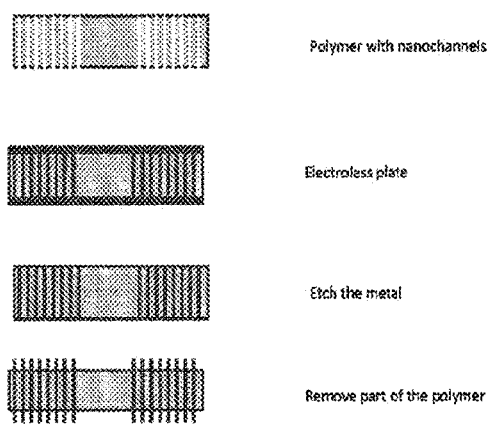
Figure 32:
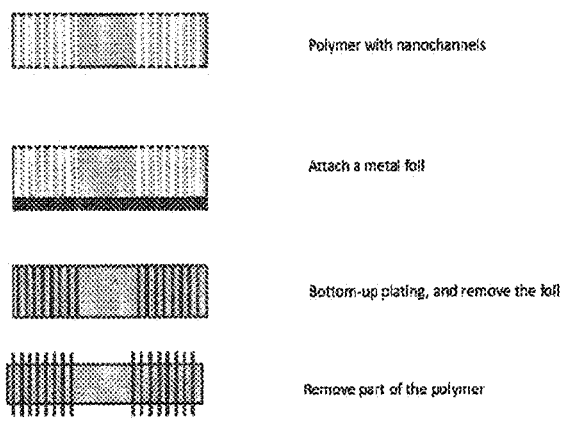

A photoresist can be subsequently added to the first surface of the dielectric body element 410 into a pattern compatible with the electronic component being connected. A plurality of conductive wires can then be placed in each of the plurality of channels 415. The conductive wires can be placed within the plurality of channels using various plating techniques, for example, electrolytic plating and/or electroless plating. It is to be noted that electroless plating happens from the side-wall filling, as illustrated in FIG. 31, while electrolytic plating involves plating from bottom-up or side-wall or combinations of both, as illustrated in FIG. 32. The photoresist can then be removed from the first surface of the dielectric body element 420. However, if the channels are formed in a pre-patterned way inside the dielectric, the photoresist process can be avoided since plating is only confined to the channels. The extra copper in the top and bottom can be removed by etching it away. Examples of pre-fabricated channels can be found in FIGS. 21-22.

Further, at least a portion of the first and second surfaces of the dielectric body element can be removed 425, such that the first and second portions of each of the conductive wires extend substantially perpendicularly beyond the top surface and bottom surfaces of the dielectric body element 425. The first and second surfaces of the dielectric body element can be removed by laser ablation, plasma etching and/or chemical dissolution techniques. The complete interconnect structure can then be interposed between two electrical components, such that the conductive wires contact solder compositions from each electrical component, thus enabling the interconnection arrays to provide conductive paths between electrical components. If desired, a fraction of the exposed conductive wires can be coated to limit surface wetting from the solder compositions.

The coatings can simply be formed by selective removal of the first and second surfaces of the dielectric body elements using lithographic methods such that a coating of the dielectric body element is left behind, around each individual conductive wire.

The coatings to prevent surface wetting can also be formed by first coating the wires with a metal, such as palladium, second coating the wires with a metal, such as copper, and selectively removing the metals from the tip. The coatings can also be formed by monolayer or multilayer chemisorptions techniques, spray, spin, dip and other wet coating techniques and other electroless metallization techniques, and/or chemical vapor deposition or physical vapor deposition techniques of oxides, nitrides, polymers. The coating can be selectively removed with anistropic etching.

EXAMPLES

The various embodiments of the present invention are illustrated by the following non-limiting example.

Example 1

Two-Dimensional NSS Models

Two-dimensional, half symmetric models in which a package is connected to a printed wiring board by NSS approach were built to study the reliability of the NSS interconnection. Linear plane stress elements with quadrilateral shape were used for the simulation. The influences of multiple geometry and material parameters on the reliability of interconnection were studied, including copper wire length, copper wire diameter, copper wire spacing, polymer thickness and package material.

Figure 5:
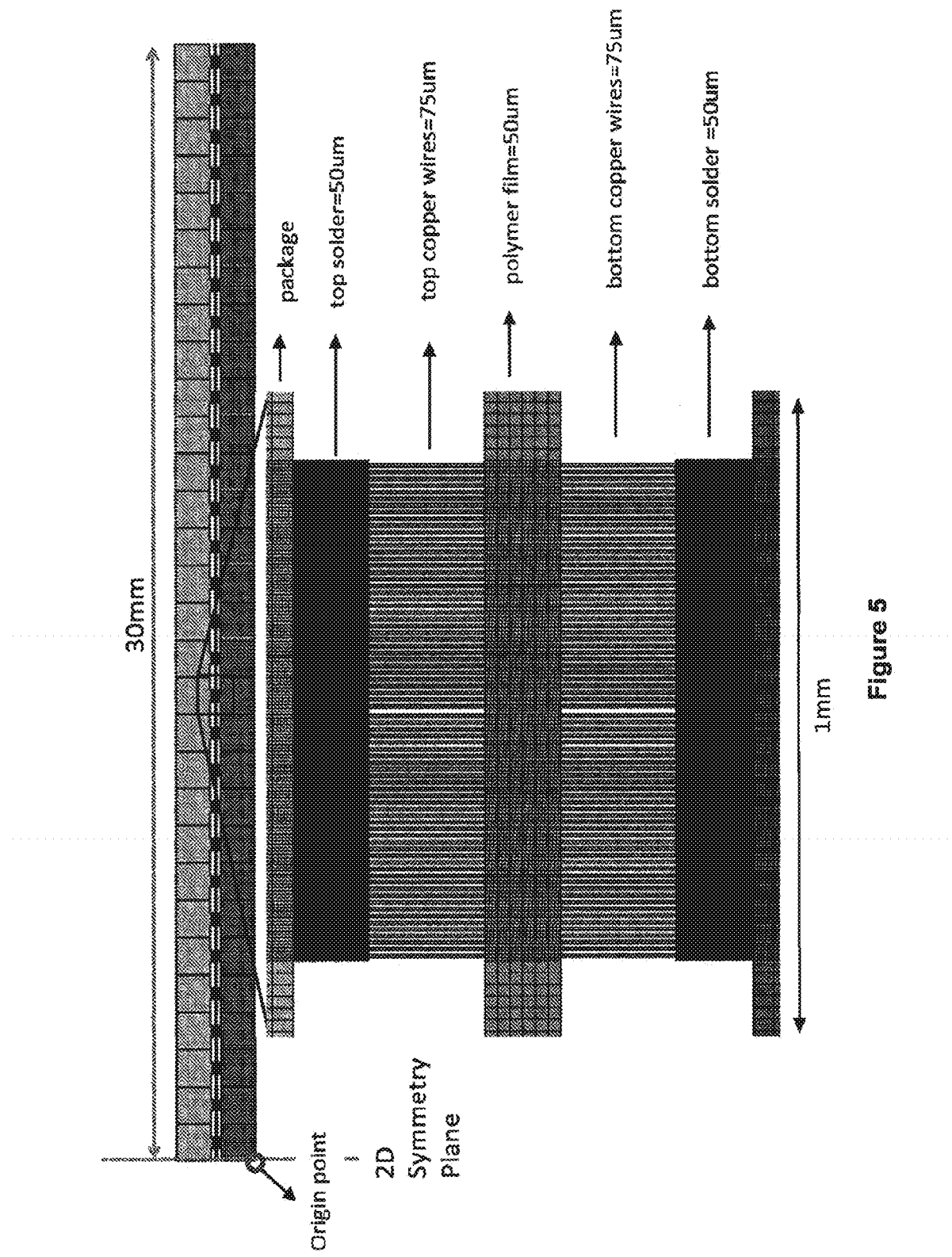
FIG. 5 illustrates an NSS, second-level interconnect structure, in accordance with exemplary embodiments of the present invention.

The geometry of the NSS structure is illustrated in FIG. 5. Copper wires with about 2 μm diameter and about 4 μm pitch were inserted in the polymer dielectric layer and connect top solder and bottom solder. The package material used in this model was silicon, with a thickness of about 1 millimeter (mm). The printed wiring board was made of FR-4, with a thickness of 1 mm. Pitch (the width of each unit) was about 1 mm, and the width of the whole structure was about 30 mm.

The solder material (SnAgCu) has temperature dependent elastic plastic properties, as shown in Table 1, all other materials were modeled as elastic materials, listed in Table 2.

Symmetric boundary conditions are applied at the structure, where the displacements in x direction of the nodes on the inner boundary are set to be zero, and the origin point is pinned.

TABLE 1

| Temperature (° C.) | Young's Modulus (MPa) | Yield Stress (MPa) |
| --- | --- | --- |
| −25 | 55790 | 41.645 |
| 25 | 52620 | 31.835 |
| 75 | 49290 | 20.975 |
| 125 | 45830 | 13.635 |

TABLE 2

| Material | Young's Modulus (MPa) | Thermal Expansion Coefficient (ppm/° C.) | Poisson's Ratio |
| --- | --- | --- | --- |
| Silicon (package) | 130000 | 2.70 | 0.28 |
| RXP-4M (polymer layer) | 1345 | 45 | 0.3 |
| Copper (copper wire) | 104000 | 17 | 0.33 |
| FR4 (PWB) | 24000 | 16 | 0.15 |

A static simulation of the cooling down process from reflow temperature (about 260° C.) to room temperature (about 25° C.) was performed. Since no time-dependent properties are used for materials, the cooling rate is not specified in simulation.

Figure 6:
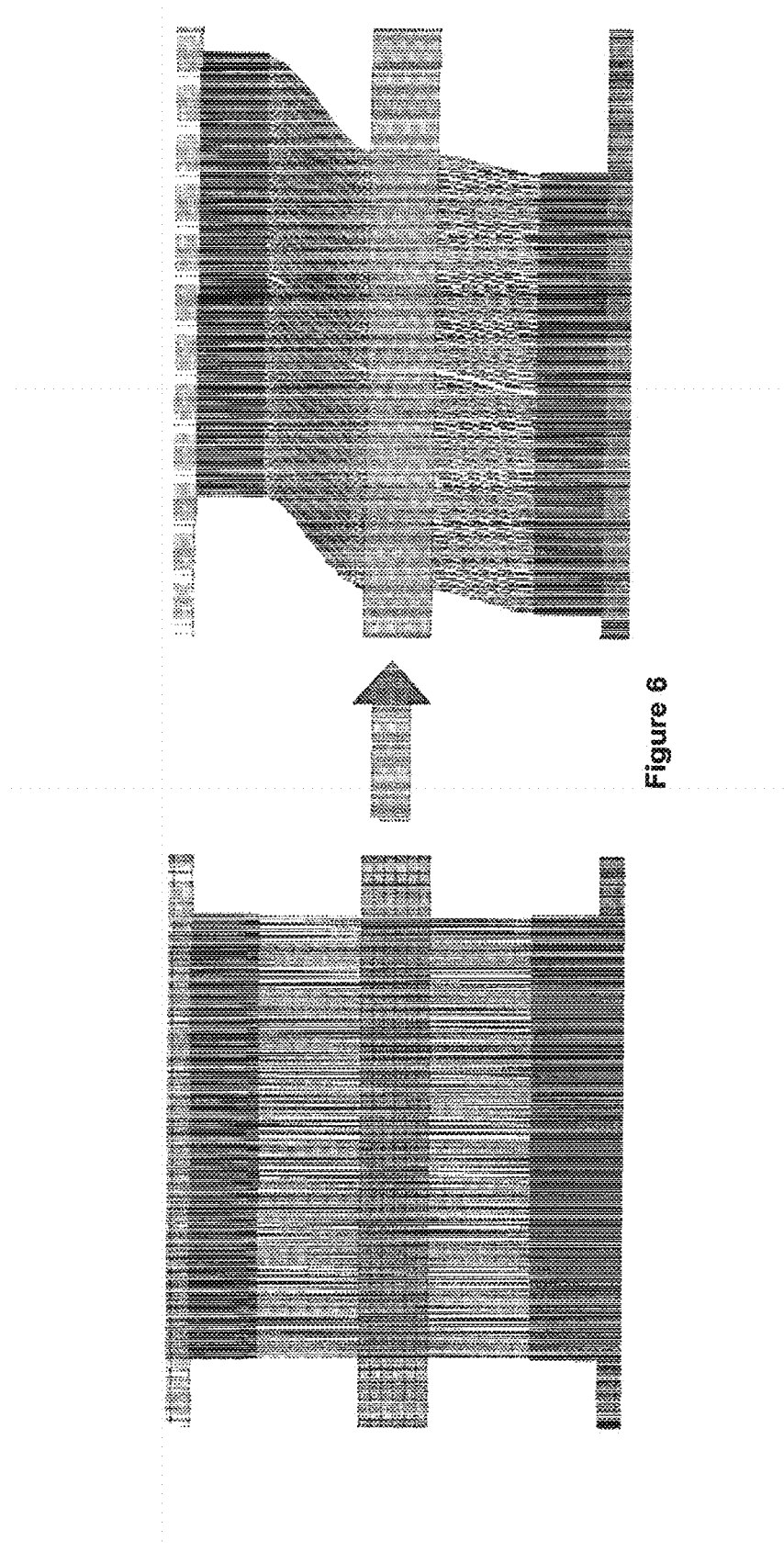
FIG. 6 illustrates deformation of an NSS, second-level interconnect structure, in accordance with exemplary embodiments of the present invention.

Shear strain was generated in solders during the cooling down process, due to the difference in expansion (shrinkage) ratio of the package and printed wiring board. In NSS structures, considerable deformation is undertaken by the compliant copper wires, as shown in FIG. 6.

Figure 7:
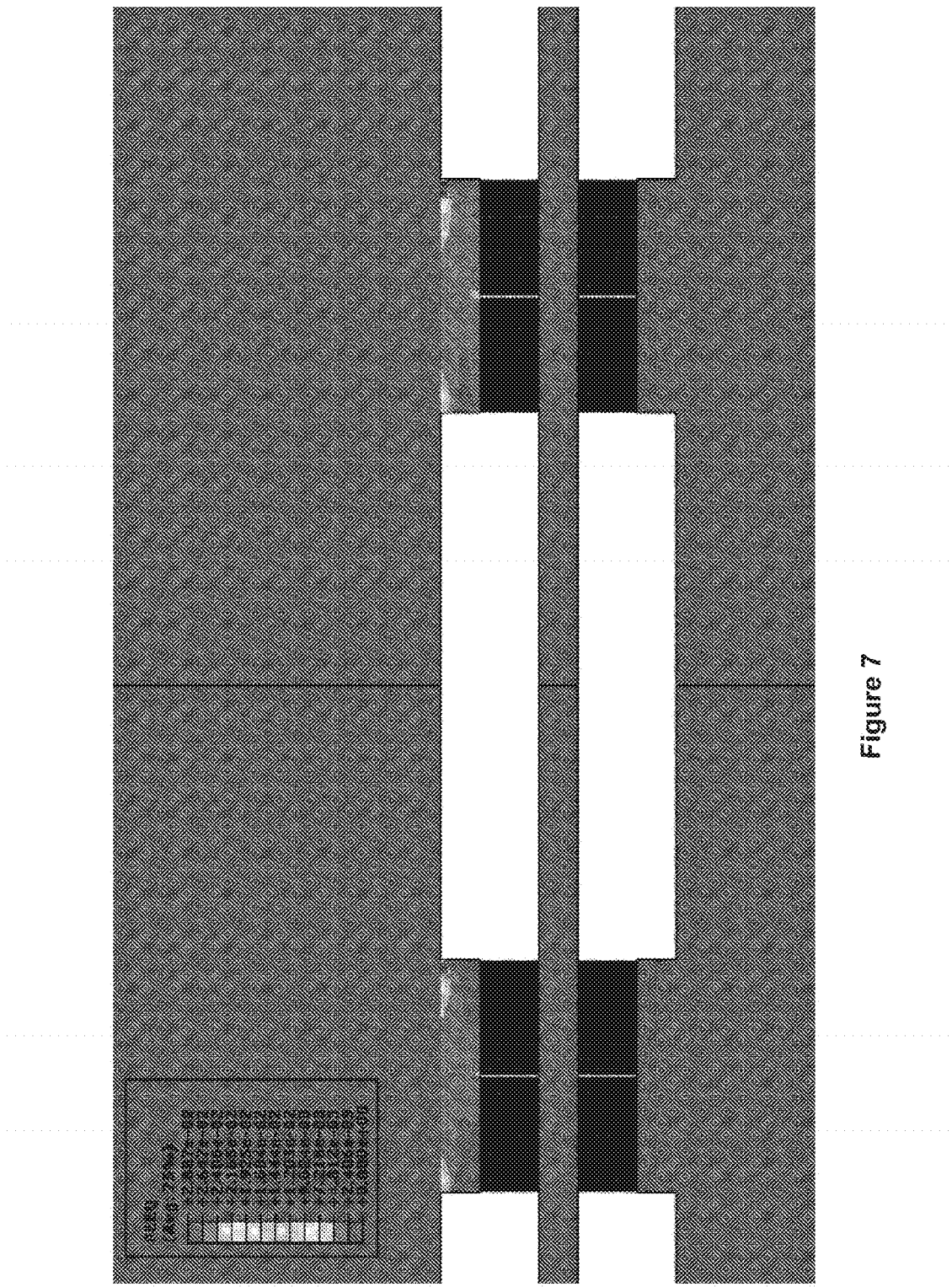
FIG. 7 illustrates plastic strain of an NSS, second level interconnect structure, in accordance with exemplary embodiments of the present invention.
Figure 8:
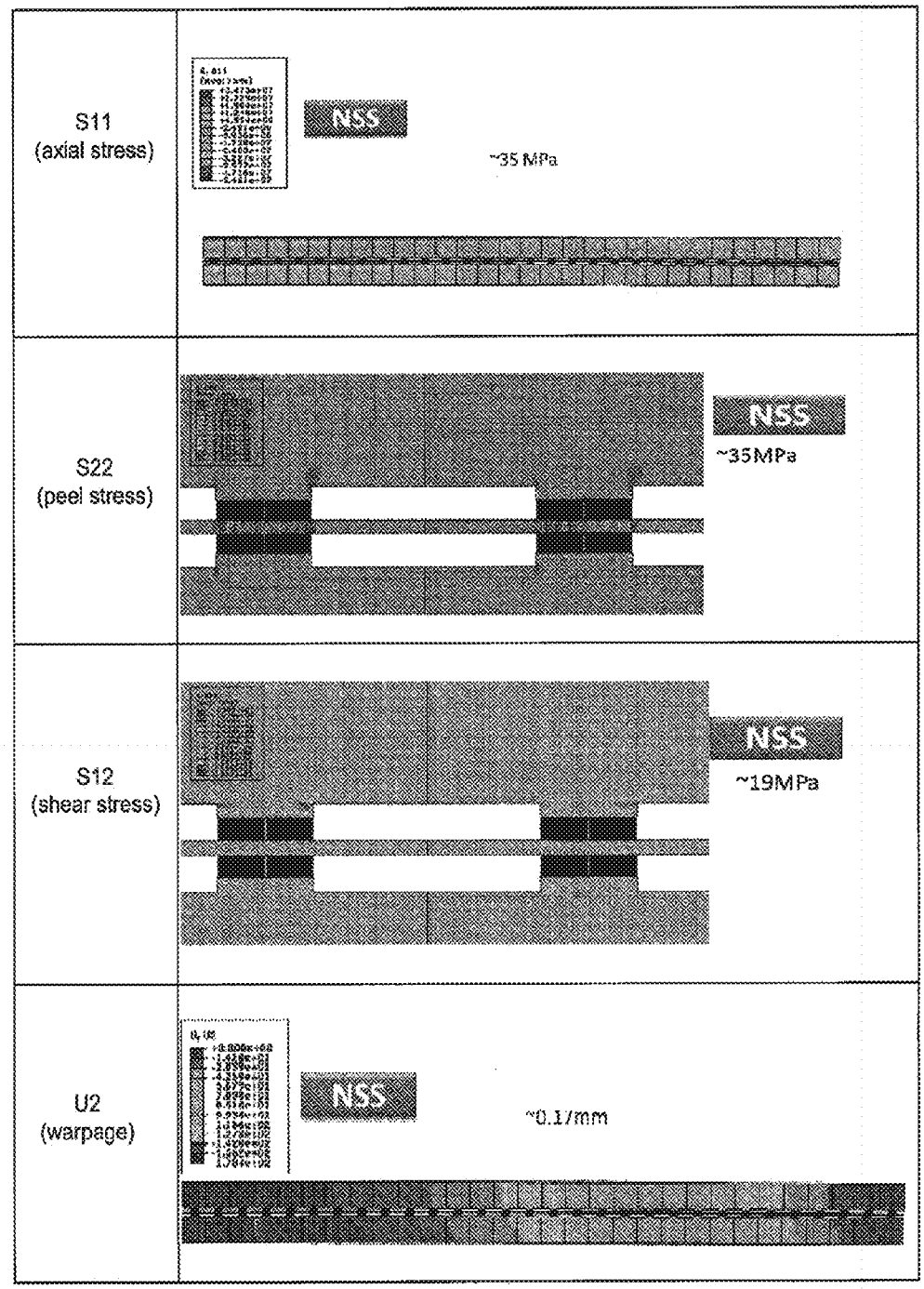
FIG. 8 illustrates stress components and warpage of an NSS, second-level interconnect structure, in accordance with exemplary embodiments of the present invention.

The equivalent plastic strains accumulated in the solders during the cooling down process were collected as the critical parameter to estimate reliability of the interconnection. The maximum plastic strain happens at the furthest solder, since it has the largest distance to neutral point (DNP). The maximum plastic strain was about 0.003, shown in FIG. 7. Stress components and warpage are illustrated in FIG. 8. The maximum axial stress and peel stress are about 35 MPa, maximum shear stress is about 19 MPa, and warpage is about 0.17 mm.

Figure 9:
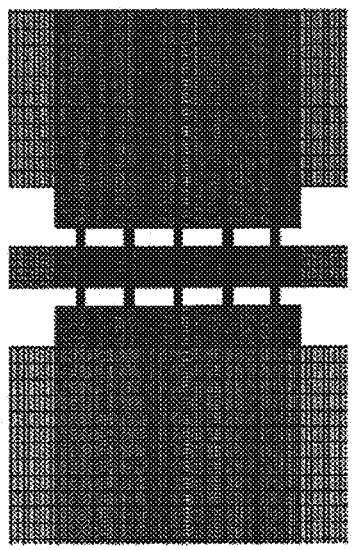
FIGS. 9-13 illustrate strain results of NSS, second-level interconnect structures, in accordance with exemplary embodiments of the present invention.
Figure 9:
Figure 9:
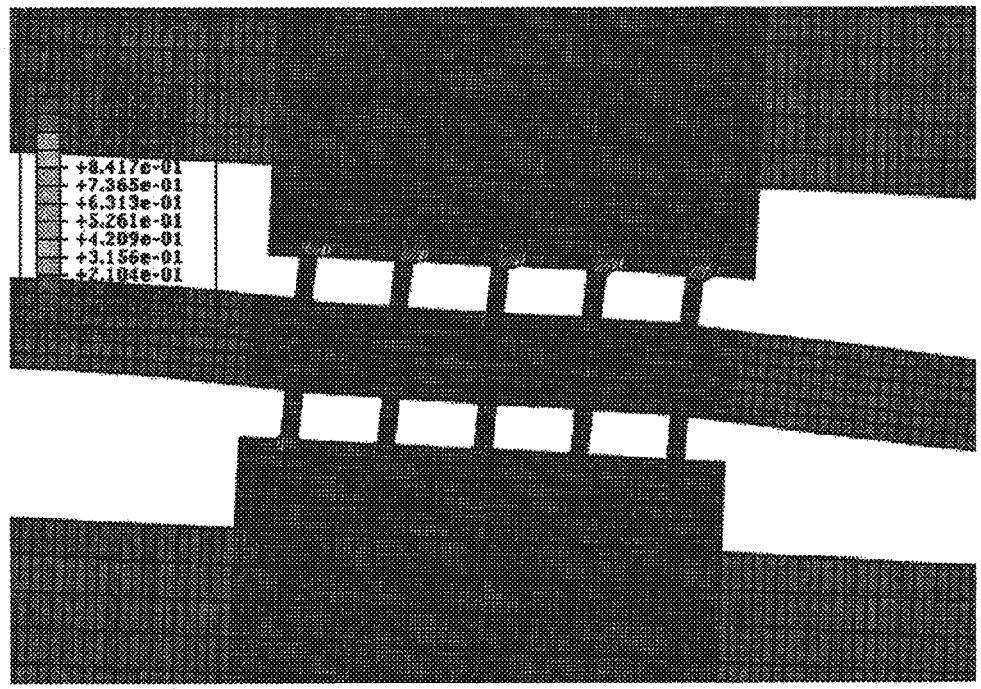

A parametric study was performed to illustrate the influence of multiple geometry and material parameters. A model with coarse copper wires was first built as a control of the study, illustrated in FIG. 9. Large plastic strain (about 1.263) was observed in solders.

Figure 10:
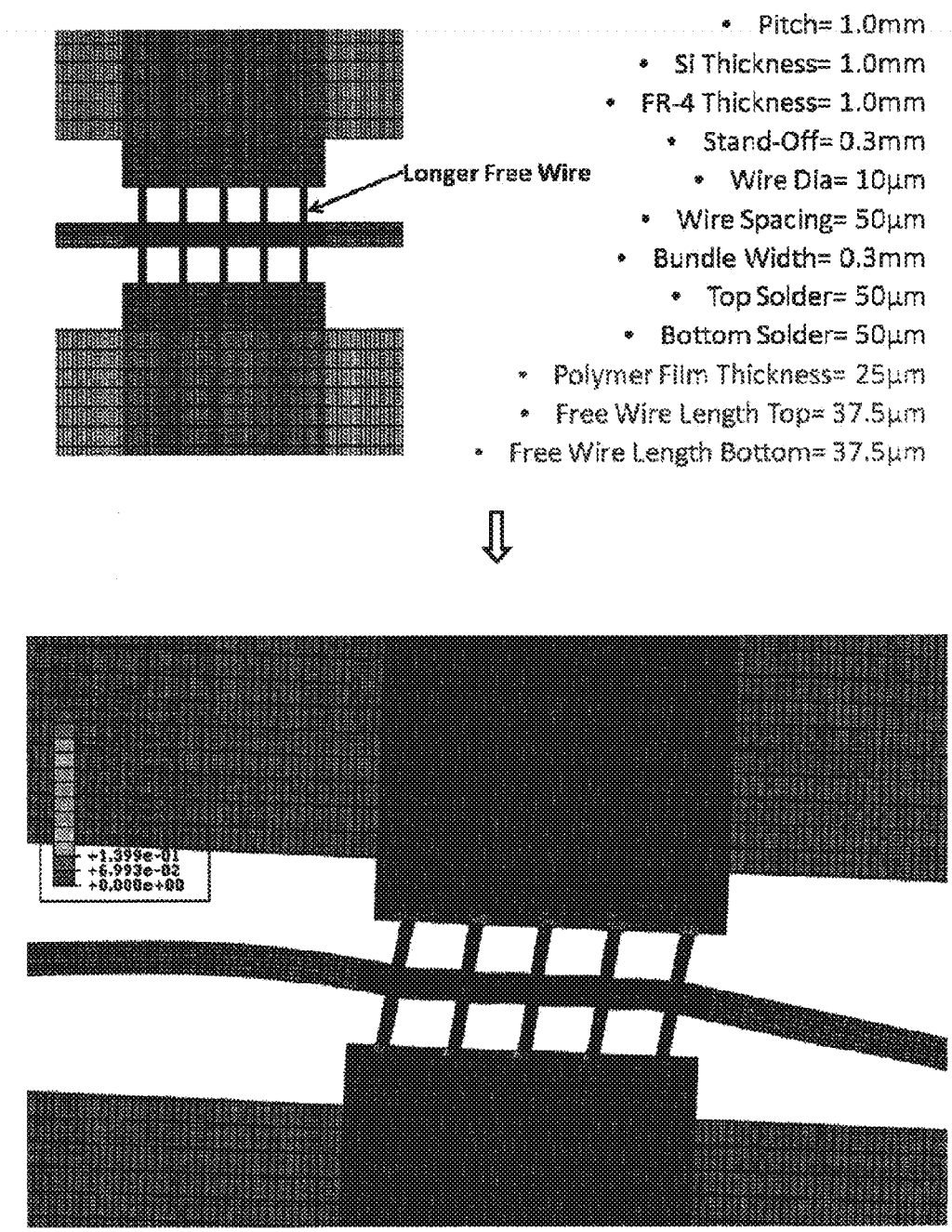

NSS structure with longer copper wires were shown to be more reliable. A model with about 37.5 μm free copper wire both on top and bottom of about 25 μm thick polymer layer connecting package and PWB was also built. And the equivalent plastic strain was decreased by about 34%, as shown in FIG. 10.

Figure 11:
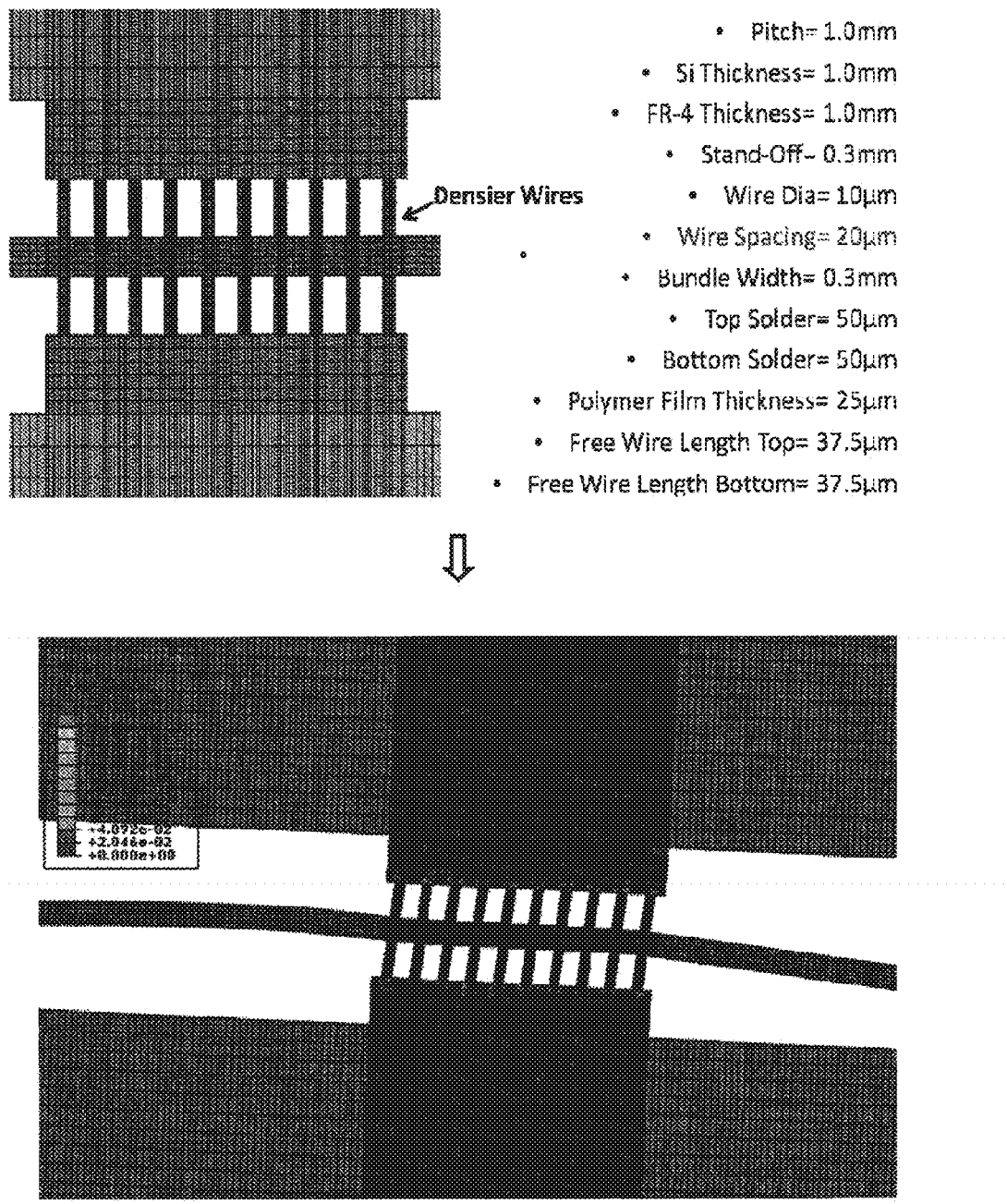

More copper wires in each unit (less spacing between copper wires) can incorporate more deformation during the cooling down process. In the model where there were 10 wires in each unit (compared to 5 in previous model), the plastic strain decrease by about 70.7%, as shown in FIG. 11.

Figure 12:
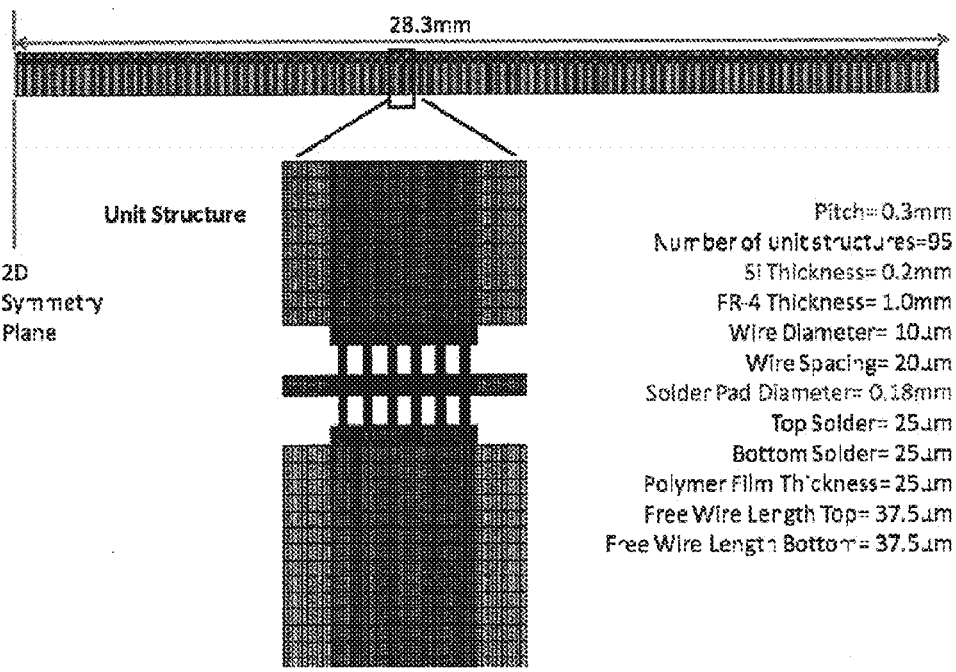
Figure 12:
Figure 12:
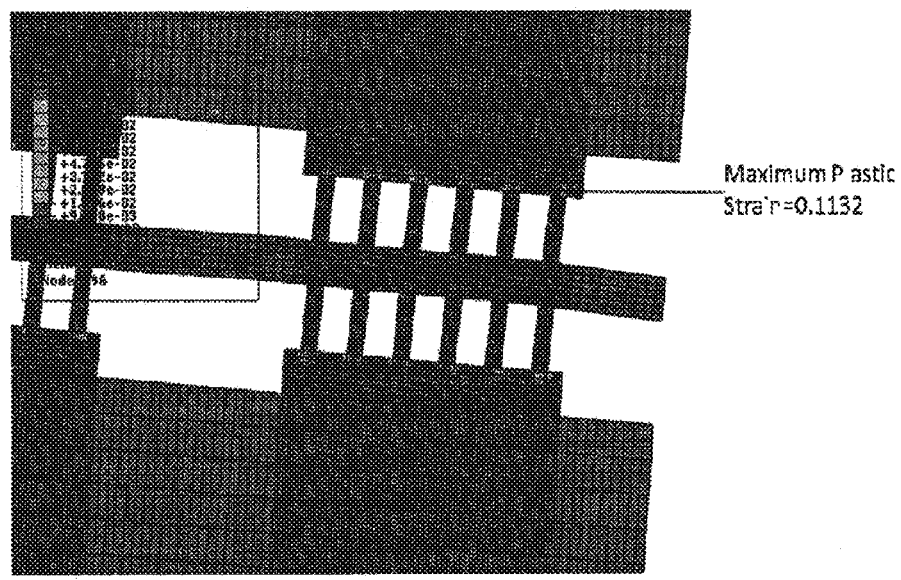

To obtain better estimation of the reliability of NSS interconnection in real assembly, a model with fine pitch was built. As shown in FIG. 12, the interconnect pitch was about 300 μm, and the package size was around about 28.3 mm, with 95 units tied together. The maximum plastic strain was shown to be about 0.1132.

Figure 13:
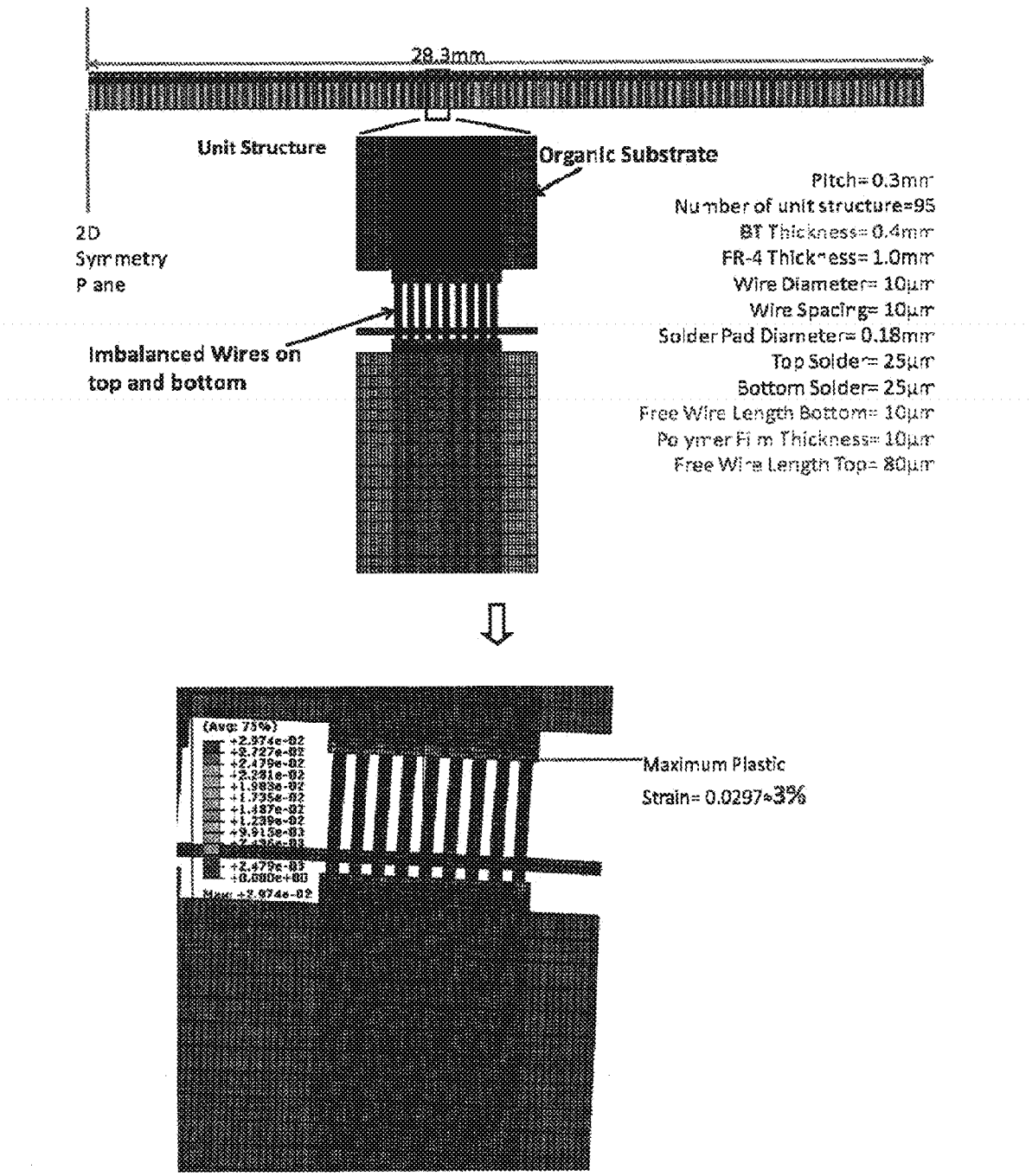

Organic materials are the mainstream materials used in package. A model where silicon substrate is replaced by a 0.4 mm BT substrate was built. Imbalanced copper wires (longer free length on top than on bottom) can incorporate more deformation, shown as in FIG. 13. The maximum plastic strain was around 3%.

Example 2

Pad Designs and Fabricated Structures

Figure 14:
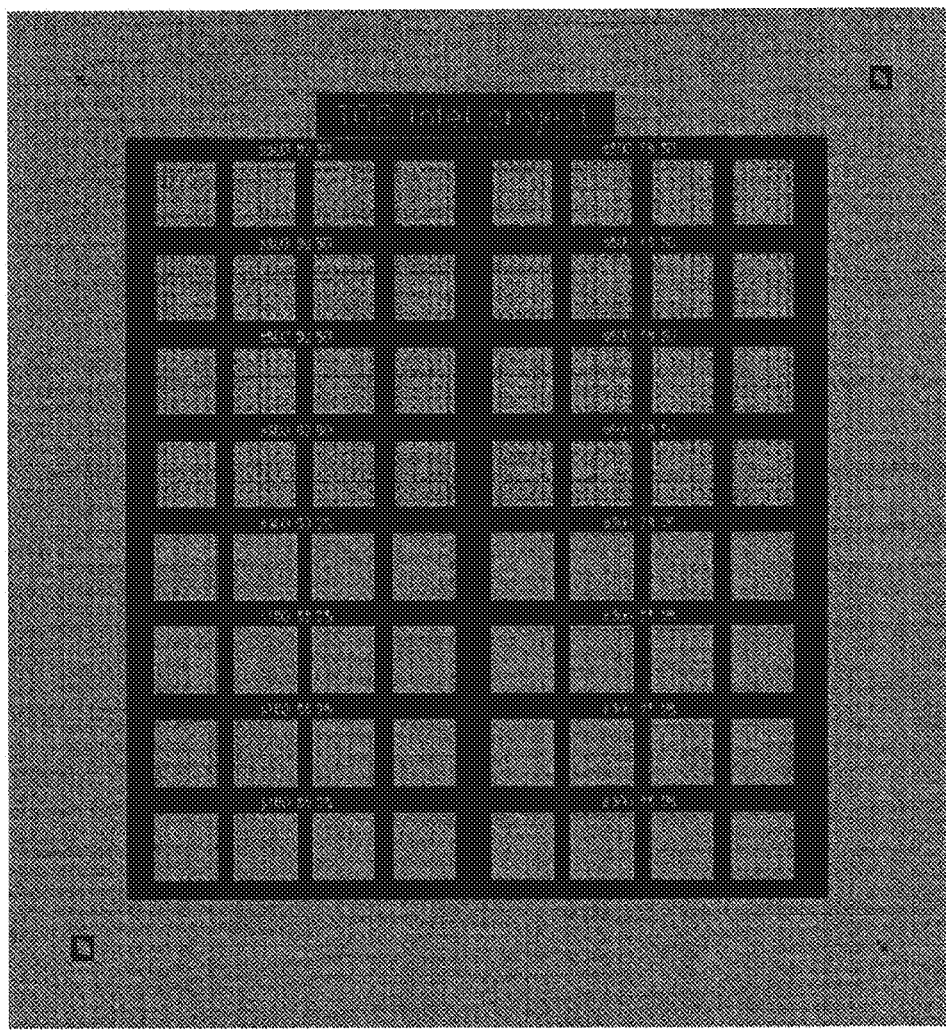
FIG. 14 illustrates a substrate design, in accordance with exemplary embodiments of the present invention.

In this example, four different pad designs were tested. The substrate design for the examples described herein is illustrated in FIG. 14. The pads were arranged in 10×10 mm coupons, wherein there were 16 coupons for each design. One skilled in the art will understand that the pad design is indicative of the configuration of the interconnection arrays and the conductive wires incorporated therein.

Figure 15:
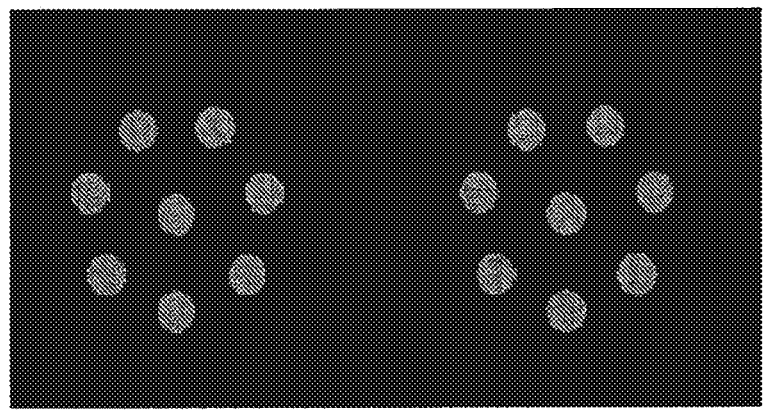
FIGS. 15-18 illustrate various pad designs, in accordance with exemplary embodiments of the present invention.
Figure 16:
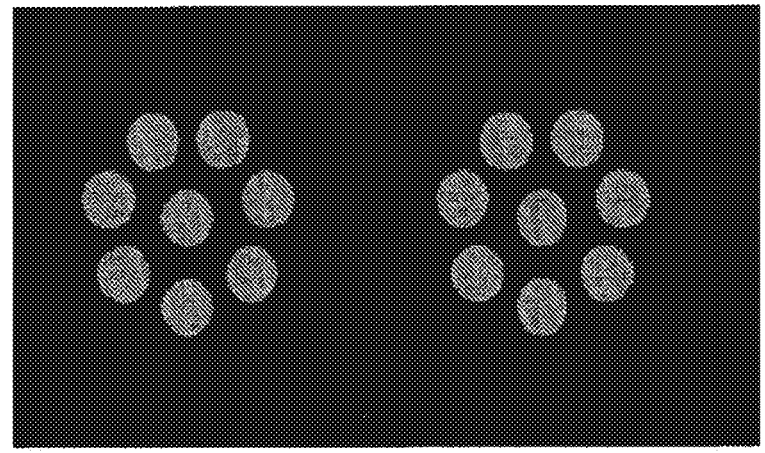
Figure 17:
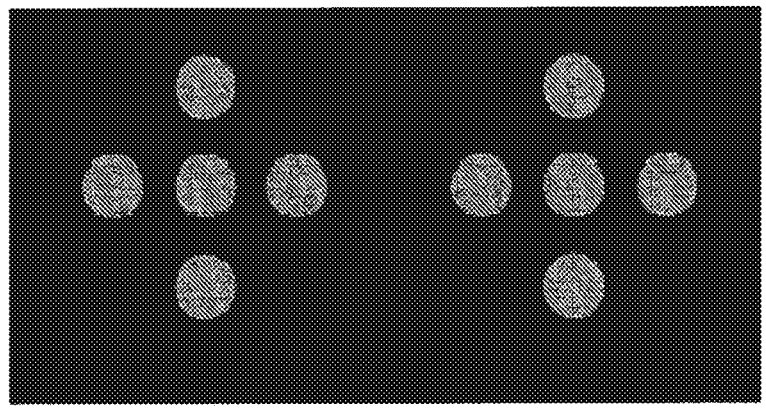
Figure 18:
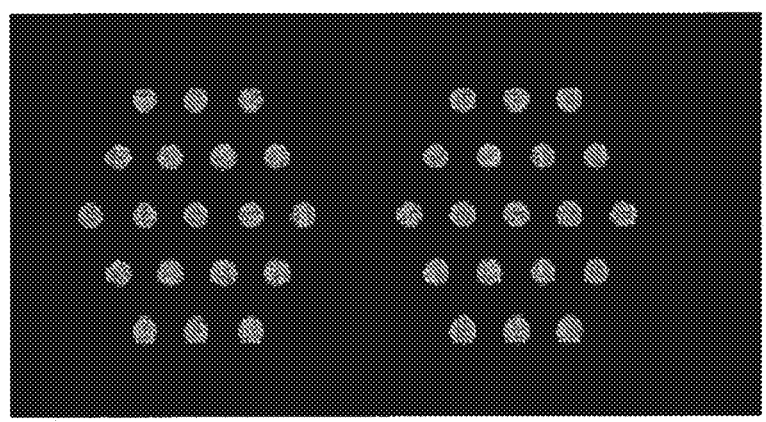

The first pad design, illustrated in FIG. 15, had a pitch of about 500 μm, a wire diameter of about 50 μm, and a distance between wires of about 50 μm. The second pad design, illustrated in FIG. 16, had a pitch of about 500 μm, a wire diameter of about 75 μm, and a distance between wires of about 25 μm. The third pad design, illustrated in FIG. 17, had a pitch of about 300 μm, a wire diameter of about 50 μm, and a distance between wires of about 25 μm. The fourth pad design, illustrated in FIG. 18, had a pitch of about 300 μm, a wire diameter of about 25 μm, and a distance between wires of about 25 μm.

The dielectric body element was then further developed. The dielectric body was formed by laser drilling, plasma etching, and laser ablation techniques. In some embodiments, the laser drilling technique included the removal of copper from one side prior to drilling. The plasma etching and laser ablation technique included thinning down copper on one side to less than about 5 μm, laminating with photoresist FX920 (20 μm thickness), exposing for about 15 to 20 seconds with 20 mW/cm², and developing and etching the copper. It was found that smaller structures had better performance with less exposure time, and larger structures had better performance with more exposure time. Further, it was found that temperature and etch time are important parameters for plasma etching. Similarly, the channels for the interconnection arrays were formed by laser drilling, plasma etching, and laser ablation techniques.

Figure 19:
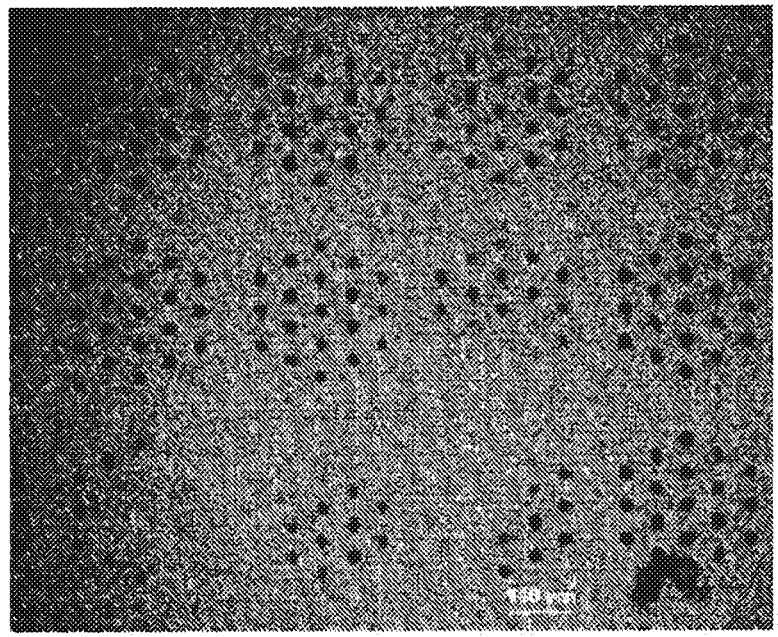
FIG. 19 illustrates a dielectric body element and interconnection arrays having too short of an exposure time, in accordance with exemplary embodiments of the present invention.
Figure 20:
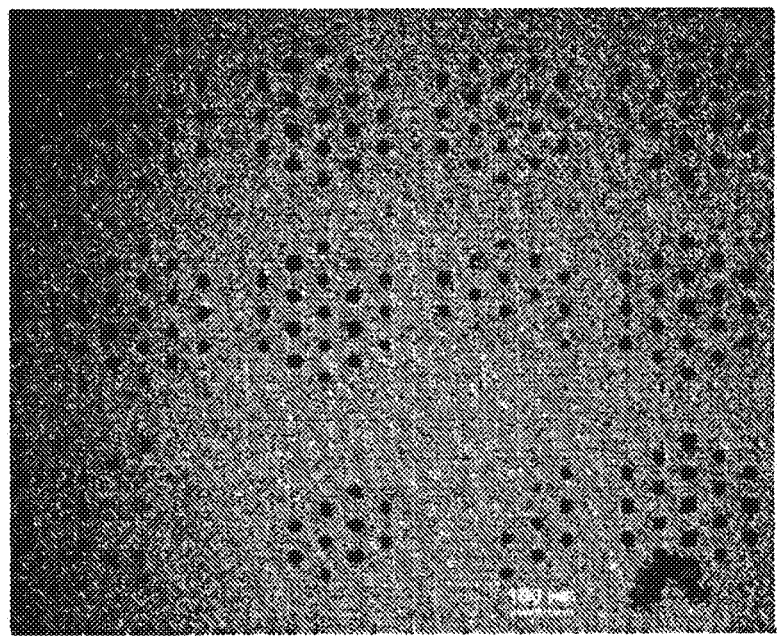
FIG. 20 illustrates a dielectric body element and interconnection arrays having too long of an exposure time, in accordance with exemplary embodiments of the present invention.
Figure 21:
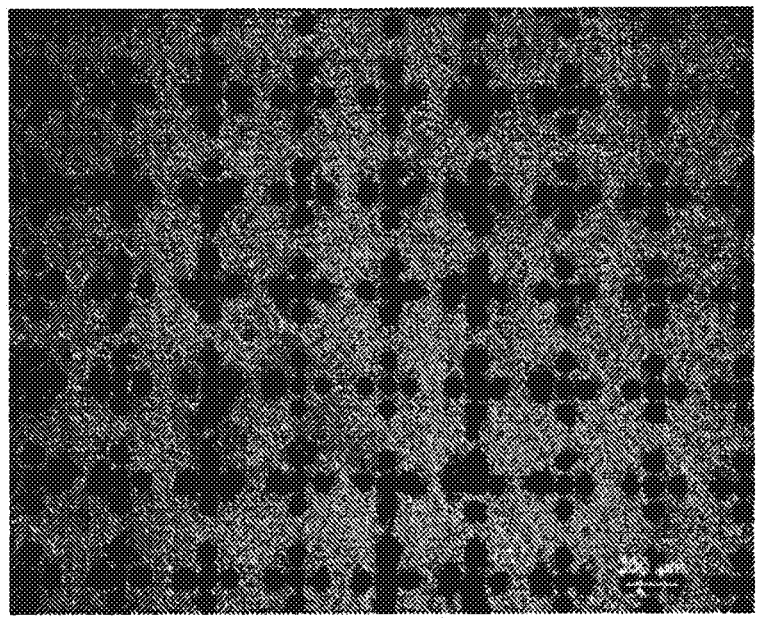
FIG. 21 illustrates laser drilled channels, in accordance with exemplary embodiments of the present invention.
Figure 22:
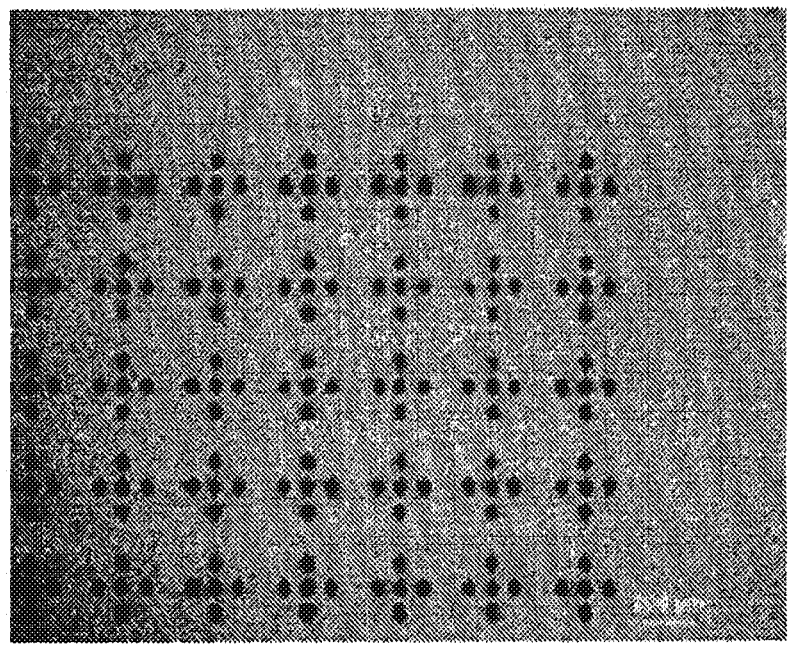
FIG. 22 illustrates laser drilled channels after $O_2$ plasma etching, in accordance with exemplary embodiments of the present invention.
Figure 23:
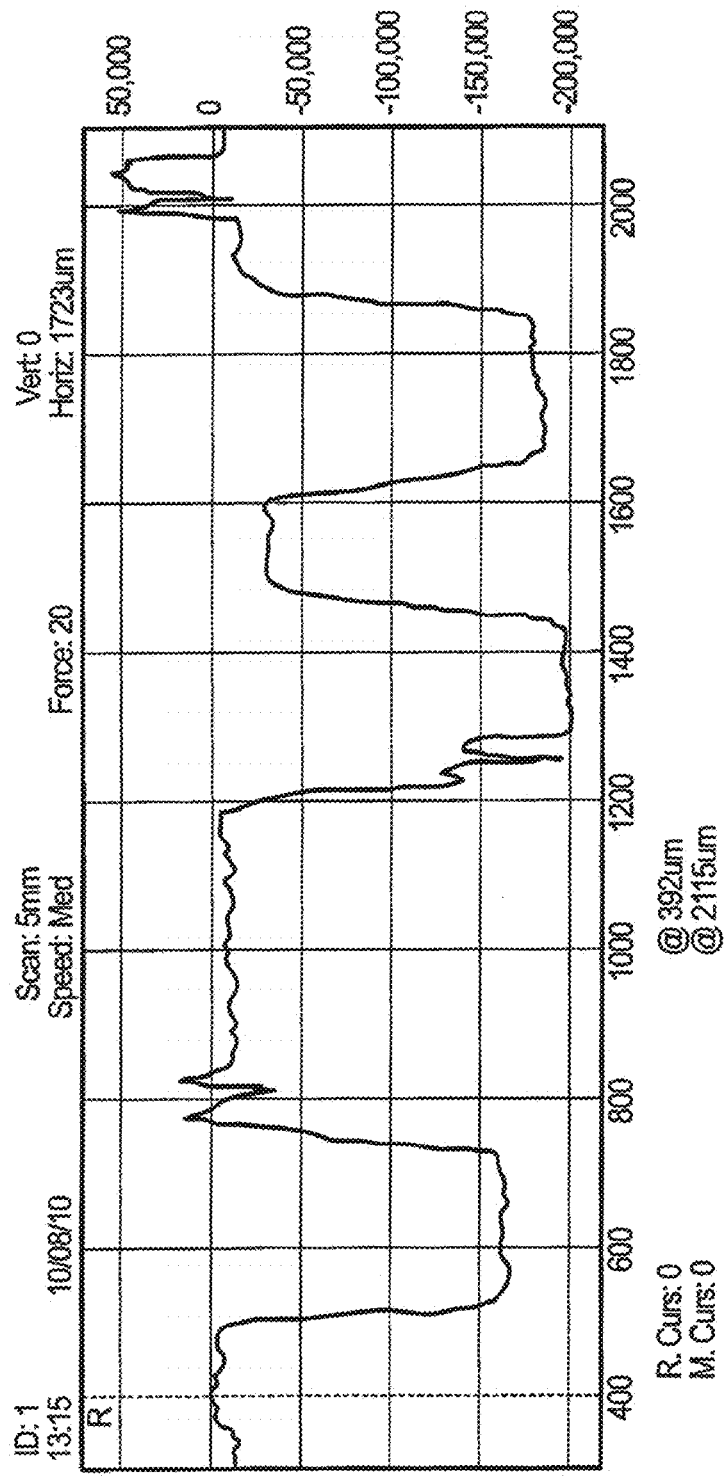
FIGS. 23-25 graphically illustrate plasma etching results, in accordance with exemplary embodiments of the present invention.
Figure 24:
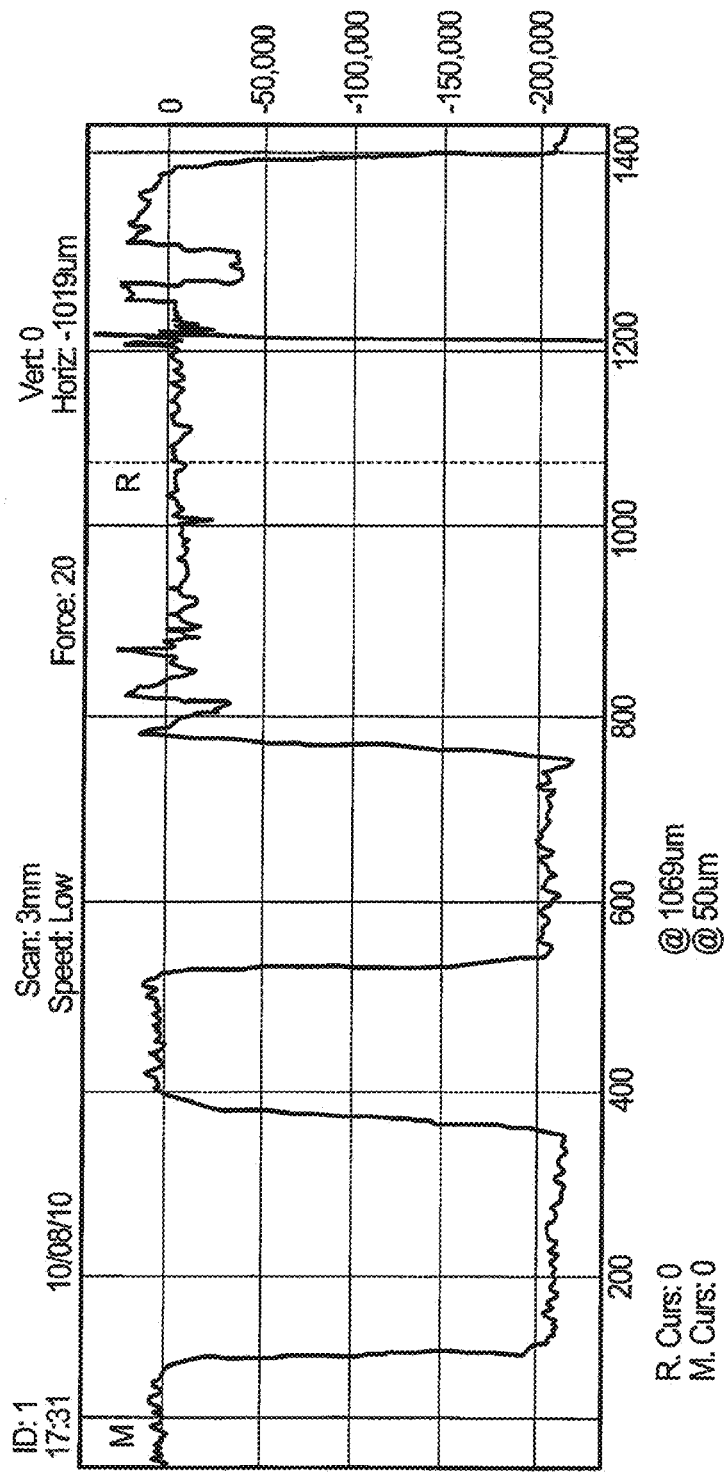
Figure 25:
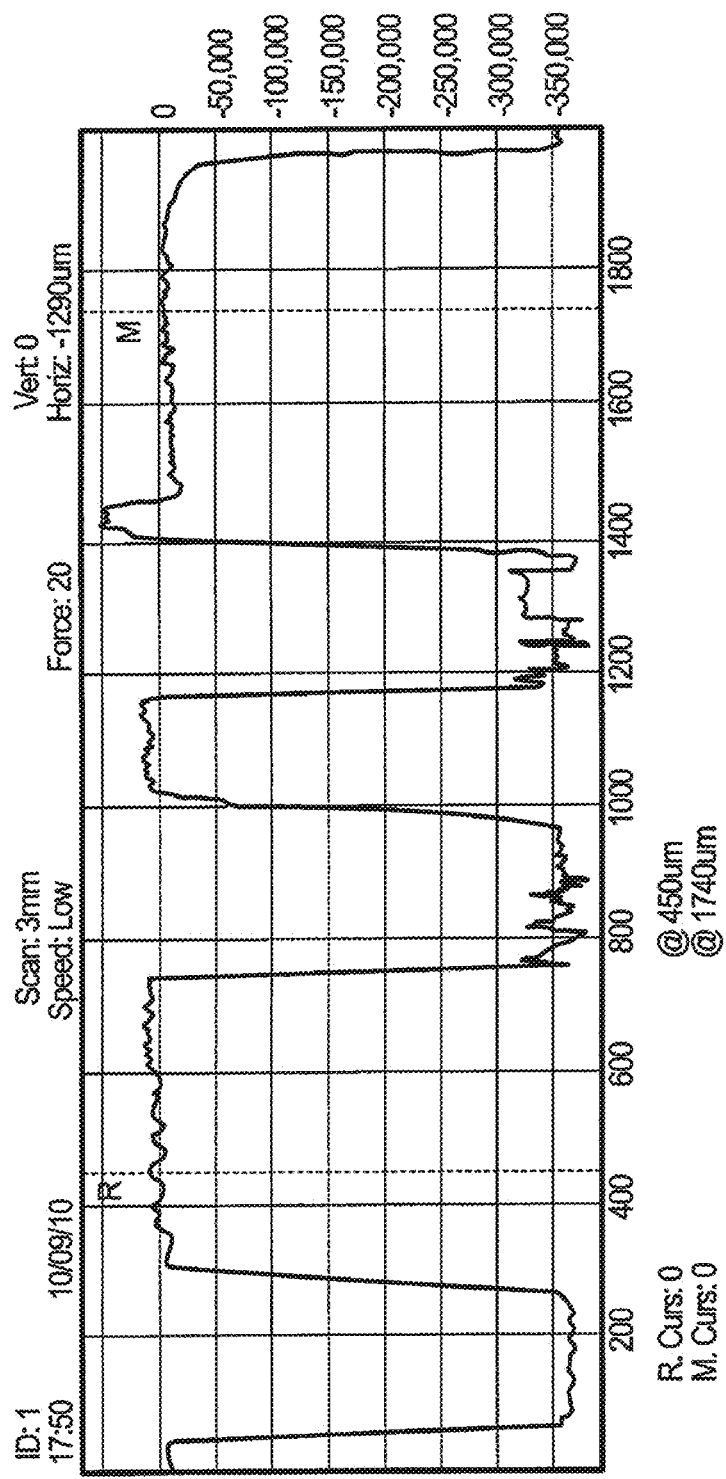

FIG. 19 illustrates a dielectric body element and interconnection arrays having too short of an exposure time. FIG. 20 illustrates a dielectric body element and interconnection arrays having too long of an exposure time. FIG. 21 illustrates laser drilled channels and FIG. 22 illustrates laser drilled channels after O₂ plasma etching. In this example, it was found that the laser drilled substrate had to be cleaned with the $O_2$ plasma for about 10 minutes to clean the borders of the holes. FIGS. 23 to 25 provide graphically illustrate plasma etching results for various embodiments of the present invention.

In reference to plasma etching, it was found that UL 3850 HT etches far too slow to drill thru 100 μm material, and that isotropic etching will also cause a much wider opening than is needed. Parameters that affect the etch rate are (1) the kind of material that is used: UL 3850, HT 0.5 μm/h was used; (2) the position in plasma chamber: the higher the shelf the higher the etch rate; (3) pressure: occasionally the pressure dropped below the set point and 50 μm of substrate were removed within a 3 h session; (4) amount of material in the chamber: it is recommended to use a FR4 board as carrier to ensure evenly etching of the substrate but the etch rate will drastically increase by just putting the substrate itself in the chamber.

Figure 26:
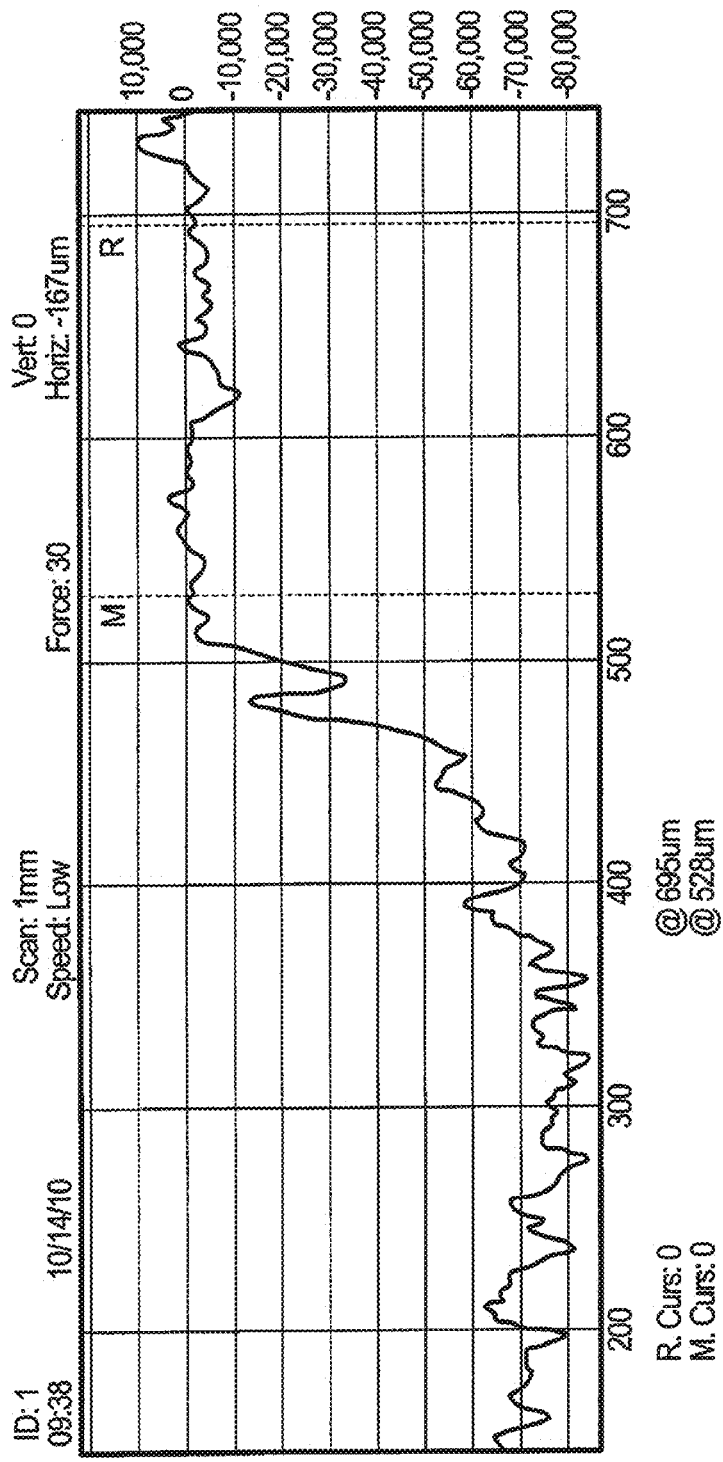
FIG. 26 graphically illustrates laser ablation results, in accordance with exemplary embodiments of the present invention.

Various laser ablation techniques were also tested including UV, $CO_2$ and excimer. FIG. 26 illustrates contact profilometry results for etch-depth after 500 excimer laser pulses on R/FLEX 3850.

Testing with UL 3850 HT revealed a low etch rate which was due to carbon redeposition during laser ablation. Intermediate $O_2$ plasma cleaning steps were introduced with cycle time of 10-20 minutes.

Figure 27:
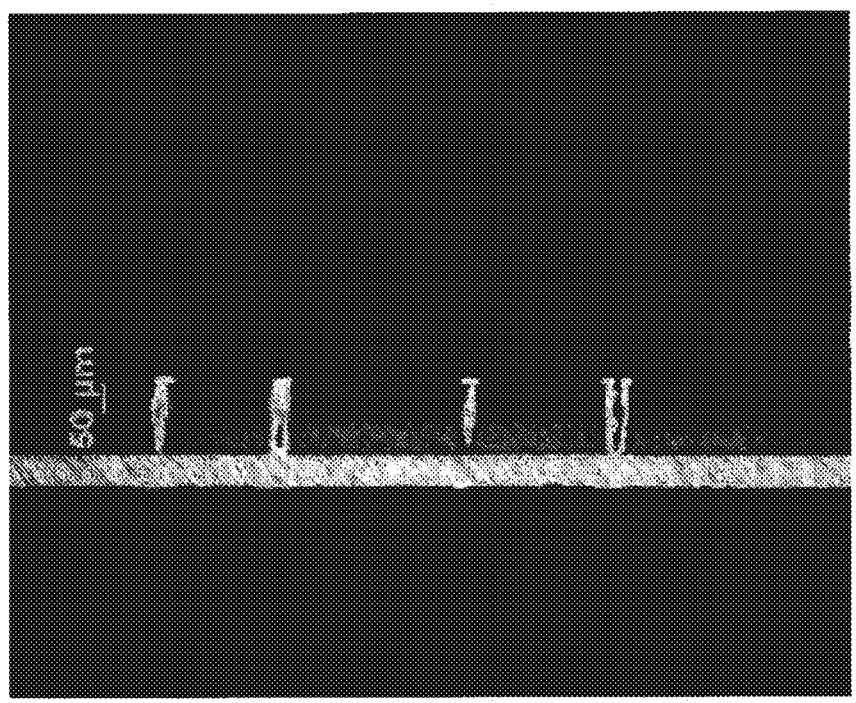
FIGS. 27-28 illustrate various interconnect structures, in accordance with exemplary embodiments of the present invention.
Figure 28:
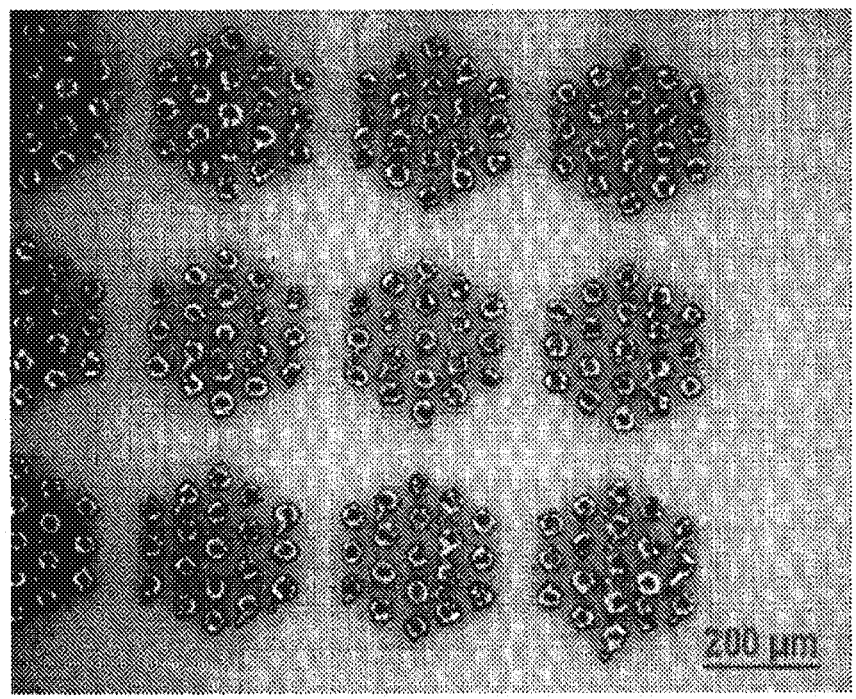
Figure 29:
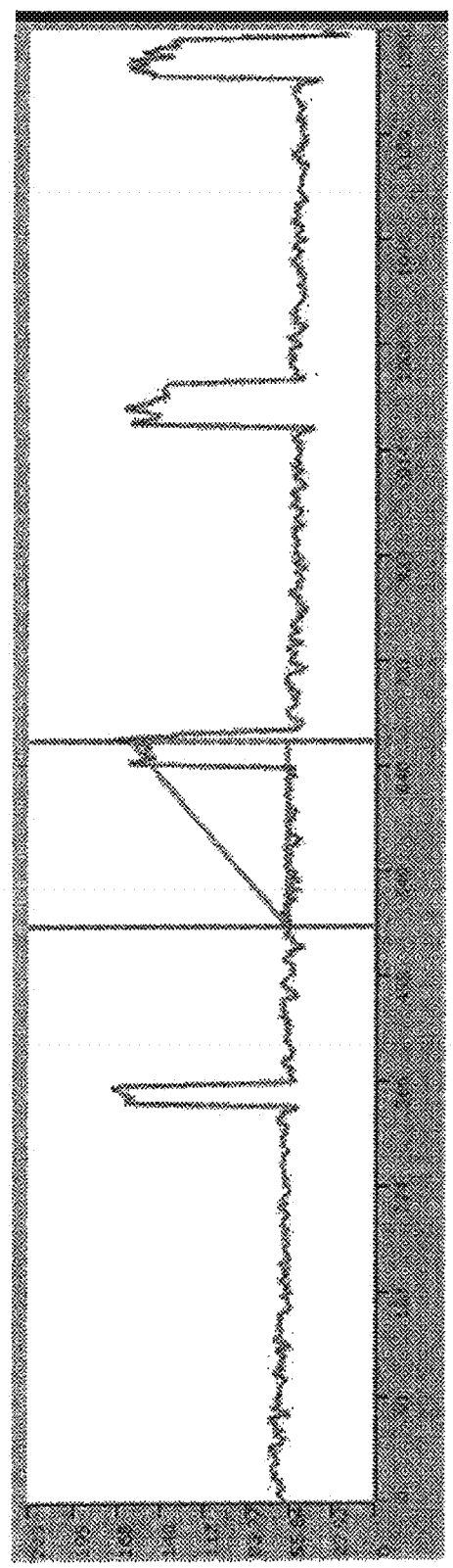
FIG. 29 graphically illustrates performance of an interconnect structure, in accordance with exemplary embodiments of the present invention.
Figure 33:
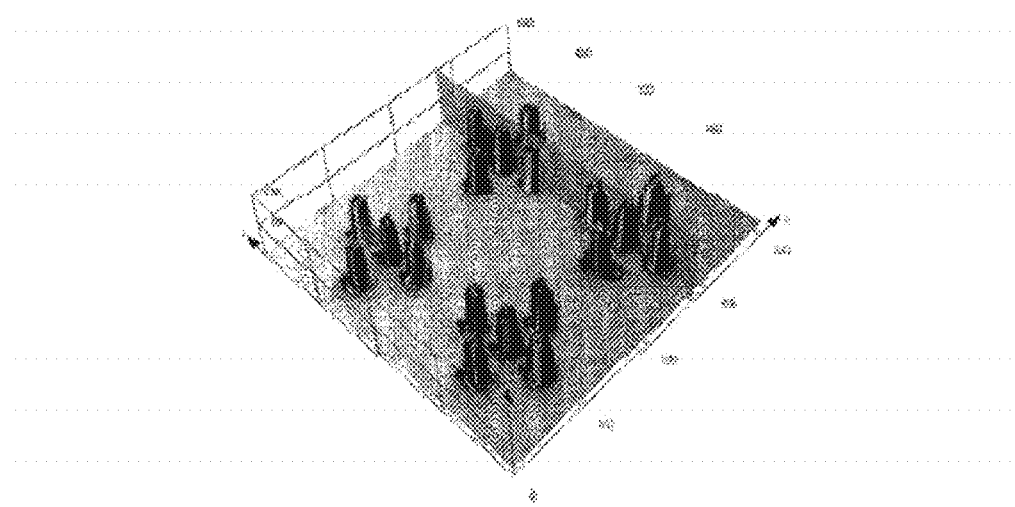
FIG. 33 illustrates a side view of an interconnect structure, in accordance with exemplary embodiments of the present invention.

FIGS. 27, 28, and 33 show the successful production of 25 μm diameter, released copper wires in UL 3850 HT material. The holes were laser drilled thru the laminated copper on both sides. Later the holes on the backside were closed by electro plating additional copper. The next step involved removal of all copper on the front side by using micro etch solution. Electro plating was then used again to bottom up fill the holes an produce the wires, which then were released using the plasma etch chamber. FIG. 29 shows a complete released 25 diameter wire structure.

While the present disclosure has been described in connection with a plurality of exemplary aspects, as illustrated in the various figures and discussed above, it is understood that other similar aspects can be used or modifications and additions can be made to the described aspects for performing the same function of the present disclosure without deviating therefrom. For example, in various aspects of the disclosure, methods and compositions were described according to aspects of the presently disclosed subject matter. However, other equivalent methods or composition to these described aspects are also contemplated by the teachings herein. Therefore, the present disclosure should not be limited to any single aspect, but rather construed in breadth and scope in accordance with the appended claims

We claim:

1. An interconnect structure, comprising:
    a dielectric body element comprising a top surface and a bottom surface;
    at least one interconnection array comprising a plurality of conductive wires dispersed within the dielectric body element;
    wherein a first portion of each of the conductive wires extends substantially perpendicularly beyond the top surface of the dielectric body element and a second portion of each of the conductive wires extends substantially perpendicularly beyond the bottom surface of the dielectric body element;
    wherein each of the conductive wires are physically and electrically isolated from each other at least within the dielectric body element;
    wherein the first and second portions are configured to provide compliance upon application of physical stresses thereto; and
    wherein each of the at least one interconnection arrays is configured to establish a conductive path between two independent electronic components with an array of pads,
    wherein the conductive path between the pads comprises a plurality of wires that are periodically patterned as a parallel wide array.

2. The interconnect structure of claim 1, wherein a fraction of the first and second portions comprises a coating configured to minimize or prevent surface wetting by a solder composition.

3. The interconnect structure of claim 1, wherein a ratio of the first portion to the second portion is greater than or equal to about 1.

4. The interconnect structure of claim 1, wherein the dielectric body element is a low stiffness polymer.

5. The interconnect structure of claim 1, wherein the dielectric body is a high stiffness polymer, polymer-glass composite, or a ceramic material.

6. The interconnect structure of claim 1, wherein an average cross-sectional dimension of each of the plurality of conductive wires is about 10 nanometers to about 50 micrometers.

7. The interconnect structure of claim 1, wherein a spacing between each of the at least one interconnection arrays is about 5 to about 1000 micrometers.

8. The interconnect structure of claim 1, wherein a spacing between each conductive wire within an interconnection array is about 10 nanometers to about 50 micrometers.

9. A system of interconnected electronic devices, the system comprising:
    a first electronic component with a first set of pads;
    a second electronic component with a second set of pads; and
    an interconnect structure interposed between the first and second electronic components, wherein the interconnect structure comprises:
    a dielectric body element comprising atop surface and a bottom surface;
    at least one interconnection array comprising a plurality of conductive wires dispersed within the dielectric body element;
    wherein a first portion of each of the conductive wires extends substantially perpendicularly beyond the top surface of the dielectric body element and a second portion of each of the conductive wires extends substantially perpendicularly beyond the bottom surface of the dielectric body element;
    wherein each of the conductive wires are physically and electrically isolated from each other at least within the dielectric body element;
    wherein the first and second portions are configured to provide compliance upon application of physical stresses thereto; and
    wherein each of the at least one interconnection arrays is configured to establish a conductive path between two independent electronic components,
    wherein a conductive path between the first set of pads and the second set of pads is formed a plurality of conducting wires that are periodically patterned as a parallel wide array.

10. The system of claim 9, wherein the interconnect structure is a second-level interconnect structure.

11. The system of claim 9, wherein a fraction of the first portion and the second portion are coated.

* * * * *